US008026662B2

(12) United States Patent
Ishihara et al.

(10) Patent No.: US 8,026,662 B2
(45) Date of Patent: Sep. 27, 2011

(54) ORGANIC LIGHT-EMITTING ELEMENT, IMAGE DISPLAY DEVICE AND PRODUCTION METHOD THEREOF

(75) Inventors: Shingo Ishihara, Yonezawa (JP); Sukekazu Aratani, Hitachiota (JP); Masaya Adachi, Hitachi (JP); Takayuki Ouchi, Hitachi (JP)

(73) Assignee: Hitachi Displays, Ltd., Chiba (JP)

( * ) Notice: Subject to any disclaimer, the term of this patent is extended or adjusted under 35 U.S.C. 154(b) by 1258 days.

(21) Appl. No.: 11/058,748

(22) Filed: Feb. 14, 2005

(65) Prior Publication Data
US 2005/0221121 A1    Oct. 6, 2005

(30) Foreign Application Priority Data
Mar. 31, 2004    (JP) .................................. 2004-101796

(51) Int. Cl.
*H01L 51/50* (2006.01)
*C09K 11/06* (2006.01)

(52) U.S. Cl. ... 313/504; 313/506; 257/40; 257/E51.024; 257/E51.047; 428/690; 428/917

(58) Field of Classification Search .................. None
See application file for complete search history.

(56) References Cited

U.S. PATENT DOCUMENTS

| | | | |
|---|---|---|---|
| 5,841,230 A * | 11/1998 | Ikoma et al. .................. 313/506 |
| 6,023,073 A * | 2/2000 | Strite ............................. 257/40 |
| 6,366,017 B1 * | 4/2002 | Antoniadis et al. ........... 313/506 |
| 6,936,962 B2 * | 8/2005 | Hamada et al. ............... 313/506 |
| 2002/0038867 A1 * | 4/2002 | Kobori et al. .................... 257/40 |
| 2002/0086180 A1 * | 7/2002 | Seo et al. ....................... 428/690 |
| 2002/0121860 A1 * | 9/2002 | Seo et al. ....................... 313/506 |
| 2003/0189401 A1 * | 10/2003 | Kido et al. ..................... 313/504 |
| 2003/0194484 A1 * | 10/2003 | Yamazaki et al. .............. 427/66 |
| 2004/0239240 A1 * | 12/2004 | Kato ............................. 313/506 |
| 2005/0233165 A1 * | 10/2005 | Ido et al. ....................... 428/690 |
| 2006/0263636 A1 * | 11/2006 | Ohsawa et al. ............... 428/690 |

FOREIGN PATENT DOCUMENTS

JP    2002-043063    2/2002
JP    2003-272857    9/2003

OTHER PUBLICATIONS

Park et al., Applied Physics Letters, (2007), vol. 90, 202103.*
Kuwahara et al., Applied Physics Letters, (2006), vol. 89, 132106.*
So et al., Applied Physics Letters, (2006), vol. 89, 262102.*

(Continued)

*Primary Examiner* — Angela Ortiz
*Assistant Examiner* — Brett A Crouse
(74) *Attorney, Agent, or Firm* — Antonelli, Terry, Stout & Kraus, LLP.

(57) ABSTRACT

It is an object to provide an organic light-emitting element having two or more light-emitting layers, wherein degradation of each constituent material for the light-emitting layer is reduced to improve reliability of the element. The present invention provides an organic light-emitting element having a laminated structure with a first mixed light-emitting layer 4 composed of a hole transport material, an electron transport material and a dopant which determines a color of an emitted light, and a second mixed light-emitting layer 5 composed of a hole transport material, an electron transport material and a dopant which determines a color of an emitted light, and also provides an image display device which uses the organic light-emitting element.

13 Claims, 25 Drawing Sheets

OTHER PUBLICATIONS

Gautier-Thianche et al., Journal of Applied Physics, (1998), vol. 83, No. 8, pp. 4236-4241.*
Seo et al., Applied Physics Letters, (2006), vol. 88, 232114.*
Lin et al., Journal of Polymer Research, (1995), vol. 2, No. 3, pp. 133-138.*

Tse et al., Japanese Journal of Applied Physics, (2006), vol. 45, No. 1B, pp. 555-557.*

Okumoto et al., Journal of Applied Physics (2006), vol. 100, 044507.*

* cited by examiner

FIG.14
(a)
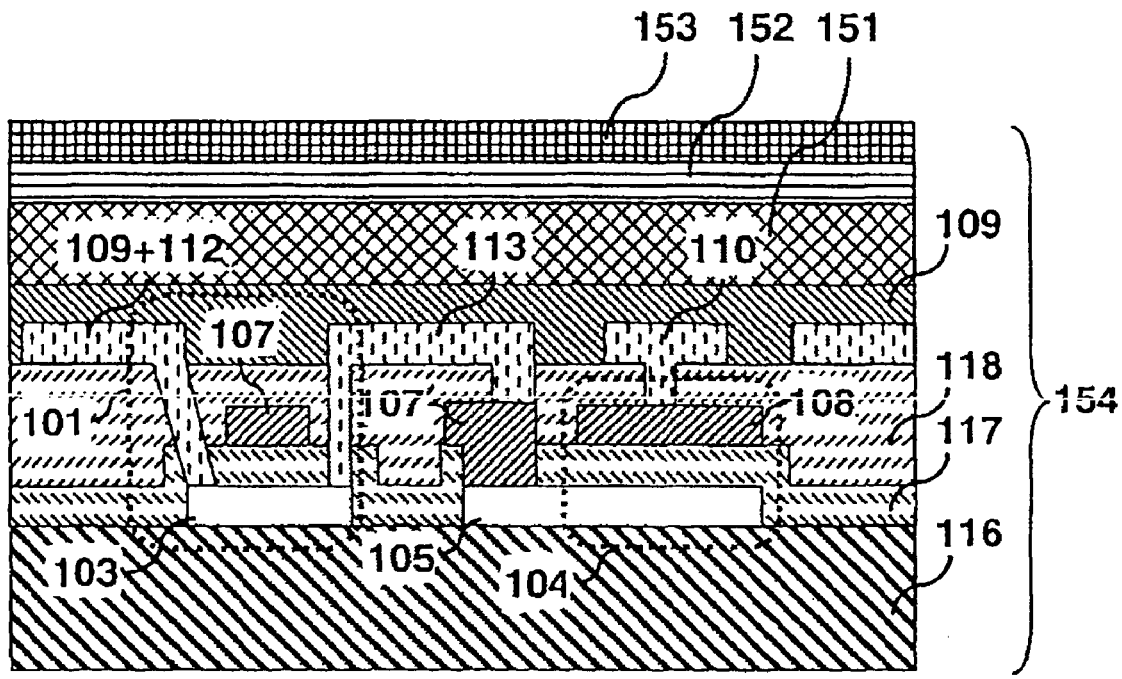
(b)
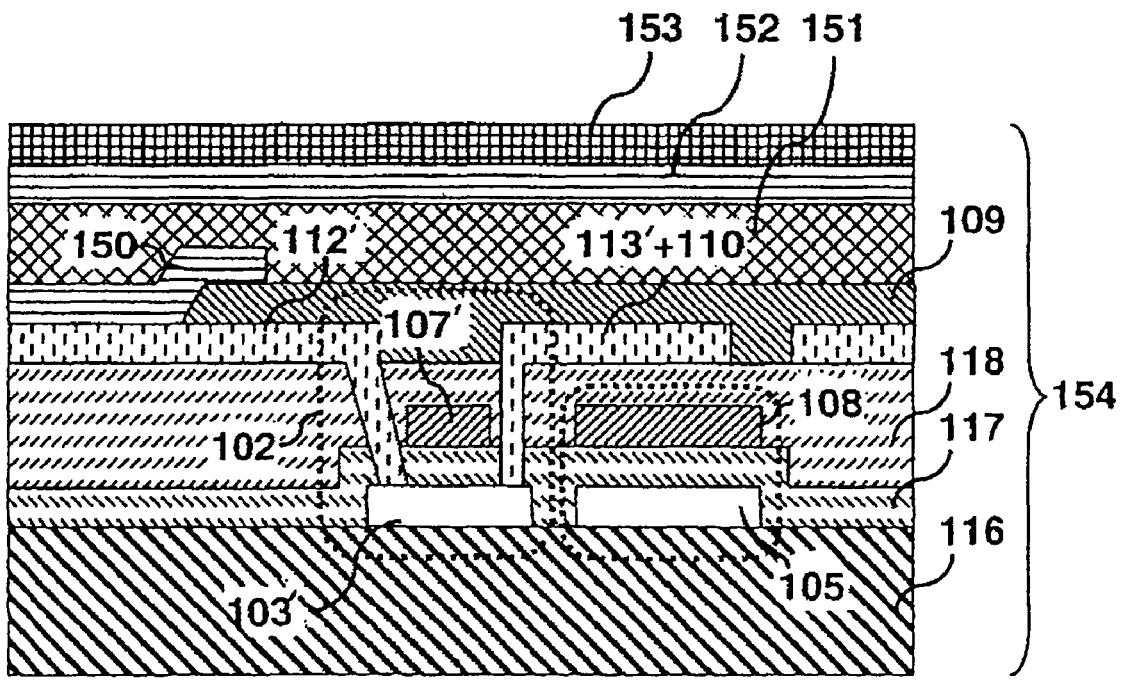

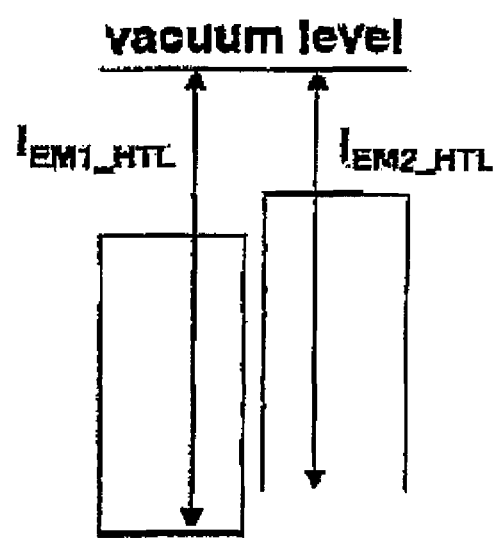 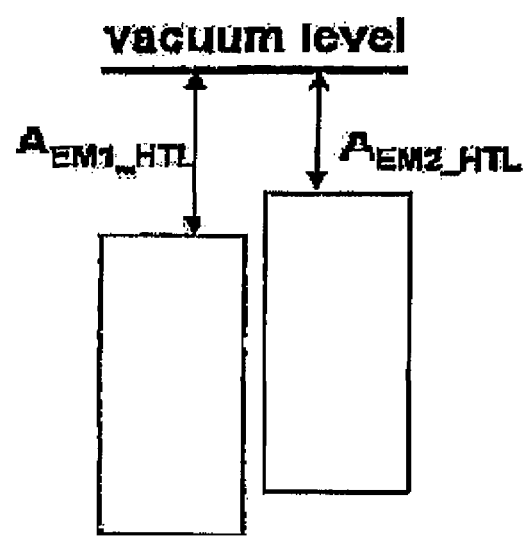
FIG. 21C

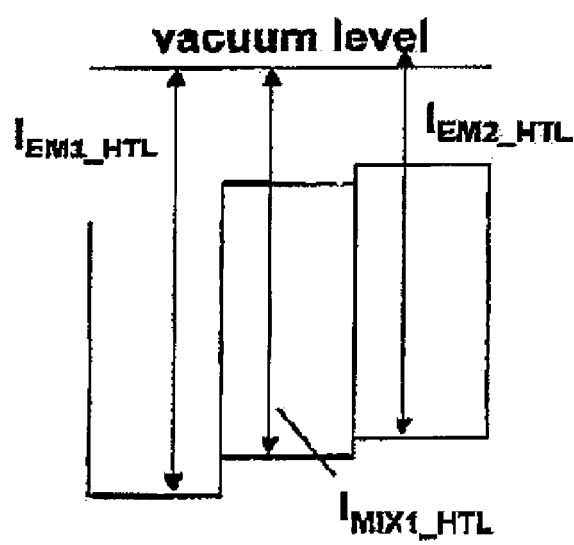
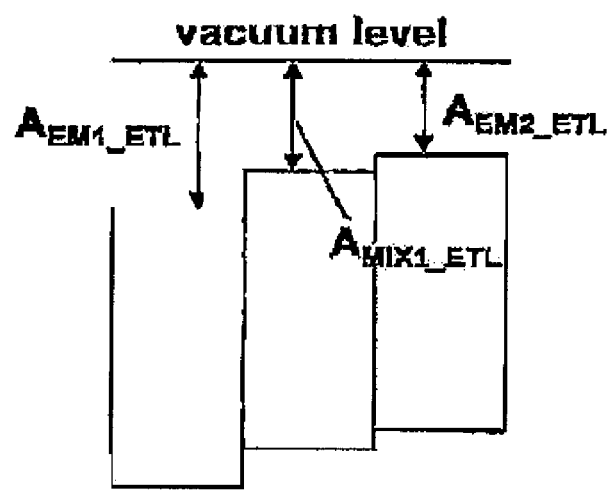
FIG. 21D

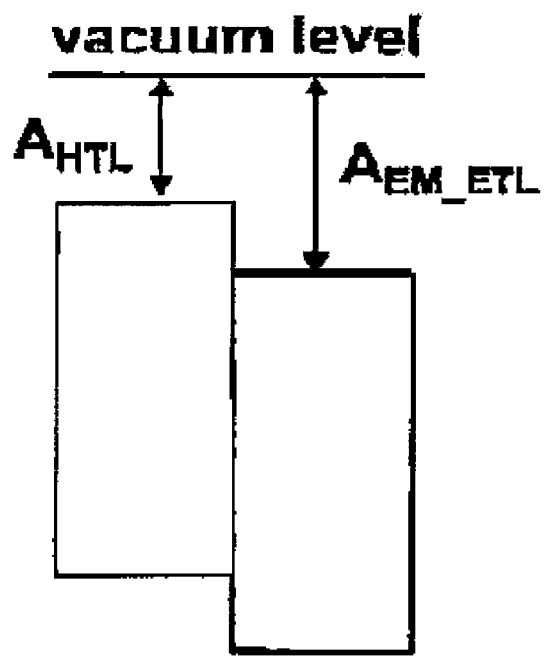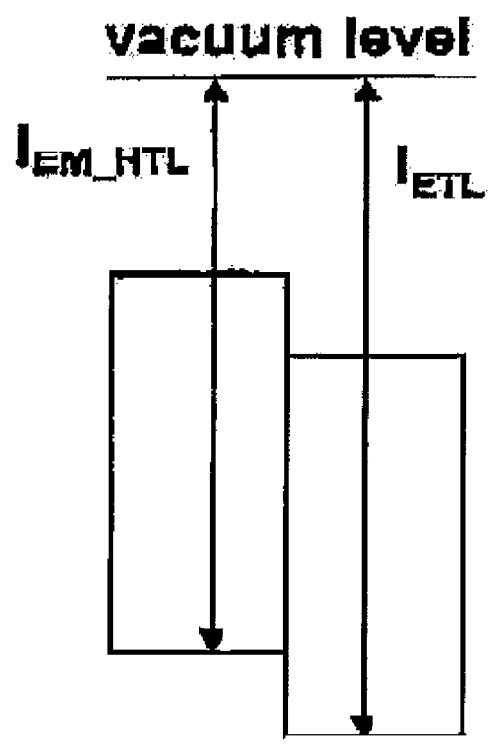
FIG. 21E

ORGANIC LIGHT-EMITTING ELEMENT, IMAGE DISPLAY DEVICE AND PRODUCTION METHOD THEREOF

FIELD OF THE INVENTION

The present invention relates to an organic light-emitting element of self-luminosity, image display device using the same element, and production method thereof.

BACKGROUND OF THE INVENTION

An organic electroluminescent element emitting white light (hereinafter referred to as organic element emitting white light) has been expected to go into various devices, e.g., thin display devices, illuminator for display devices and illuminator.

Patent Document 1 discloses a structure of organic element emitting white light. It has two light-emitting layers, one emitting a blue color on the anode side and the other a yellow to red color on the cathode side, where each layer contains a dopant which determines color of emitted light. It discloses a 10 nm thick layer for emitting a blue color and 40 nm thick layer for emitting a yellow to red color in EXAMPLE 1, suggesting a low hole transport capacity of the material for the blue-emitting layer.

A material for a light-emitting layer generally has a high hole transport or electron transport capacity. Therefore, electrons and holes are combined with each other at the light-emitting end on the electrode side, in which a carrier of low hole transport capacity is injected.

Patent Document 2 discloses an organic electroluminescent element comprising a mixed layer of hole transport material, electron transport material and dopant as a light-emitting layer. In this light-emitting layer, each of holes and electrons move in a material of high transport capacity, to control its degradation. The document also discloses a structure of organic element emitting white light, where the transport layer adjacent to the light-emitting layer is incorporated with a dopant to achieve light of white light spectral pattern by the light-emitting layer and dopant-containing transport layer.
Patent Document 1: JP-A 2003-272857
Patent Document 2: JP-A 2002-043063

BRIEF SUMMARY OF THE INVENTION

The light-emitting element disclosed by Patent Document 1 has two laminated light-emitting layers. In this structure, carriers of low transport capacity should move through a light-emitting layer before they are injected into the adjacent light-emitting layer. This may cause degradation of the light-emitting layer through which carriers move and hence problems related to element reliability. In the element disclosed by Patent Document 2, on the other hand, carriers of low transport capacity should move through a transport layer of high transport capacity material, which may also cause problems related to element reliability.

It is an object of the present invention to provide an organic element emitting white light of high structural reliability. It is another object to apply the same element to display devices. It is still another object to apply the same element to illuminators for liquid-crystal display devices. It is still another object to provide a structure capable of reducing light interference effects, which may occur as laminated film thickness increases.

The present invention includes the following aspects to solve the above problems.

In the present invention, a light-emitting layer placed between an anode and cathode comprises at least two mixed light-emitting layers, each being composed of a hole transport material, an electron transport material, and a dopant which determines a color of an emitted light.

The at least two mixed light-emitting layers are laminated continuously, or via a mixed transport layer of hole and electron transport materials.

Of the two or more mixed light-emitting layers, the one closest to the anode is coated with the hole transport layer on the anode side, and the one closest to the cathode is coated with the electron transport layer on the cathode side.

The organic light-emitting element may have the following structure;
(1) Board/lower electrode/first injection layer/first transport layer/light-emitting layer/second transport layer/second injection layer/upper electrode/protective layer or sealing (opposed) board,
(2) Board/lower electrode/first injection layer/first transport layer/mixed light-emitting mixed light-emitting layer/second transport layer/second injection layer/upper electrode/protective layer or sealing (opposed) board, or
(3) Board/lower electrode/first injection layer/first transport layer/mixed light-emitting layer/mixed transport layer/mixed light-emitting layer/second transport layer/second injection layer/upper electrode/protective layer or sealing (opposed) board.

The structure (2) has two mixed light-emitting layers laminated continuously. It may have 3 or more mixed light-emitting layers laminated continuously. The structure (3) has a mixed transport layer placed between mixed light-emitting layers. It may have one or more laminated structure of mixed transport layer/mixed light-emitting layer.

The lower and upper electrodes constitute a pair of electrodes with one or more light-emitting layers in-between, the former electrode being closer to the glass board, and the latter electrode being farther to the glass board.

There are two lower electrode/upper electrode combinations. One combination represents a structure with the lower and upper electrodes working as an anode and cathode, respectively. In this case, the first injection and first transport layers work as the hole injection and hole transport layers, respectively, and the second transport and second injection layers work as the electron transport and electron injection layers, respectively.

The other combination represents a structure with the lower and upper electrodes working as a cathode and anode, respectively. In this case, the first injection and first transport layers work as the electron injection and electron transport layers, respectively, and the second transport and second injection layers work as the hole transport and hole injection layers, respectively.

In the above structure, the first or second injection layer may be eliminated. Moreover, the first or second transport layer may also work as a light-emitting layer.

A combination of the upper and lower electrodes is preferably structured to have one electrode transmitting emitted light and the other reflecting emitted light. In the above structure, light is emitted from the light-transmitting electrode, and this electrode is referred to as a light-emitting electrode. The other electrode is referred to as a light-reflecting electrode.

The structure is of a top emission type when the upper electrode emits light, and a bottom emission type when the lower electrode emits light.

The board in the above structure may be made of a material selected from a wide range, so long as it is insulting. More specifically, they include inorganic materials, e.g., glass and sintered alumina; and various insulating plastics, e.g., polyimide, polyester, polyethylene, polyphenylene sulfide and polyparaxylene formed into a film.

Even a metallic material may be used without causing any problem, when it is coated with an insulating material described above. More specifically, the metallic materials useful for the present invention include, but not limited to, stainless steel, aluminum, copper, and an alloy thereof.

The board for the present invention is portable, light and capable of being formed into a thin film, and hence is preferably flexible. More specifically, the materials useful for the present invention include, but not limited to, thin glass (thickness: 0.5 mm or less) coated with an insulating plastic, insulating plastics described above, and metals also described above.

The anode for the present invention is preferably of an electroconductive film of high work function, which can enhance hole injection efficiency. More specifically, the materials useful for the present invention include, but not limited to, gold and platinum.

The anode may be a two-element system, e.g., indium tin oxide (ITO), indium zinc oxide (IZO) or indium germanium oxide; or three-element system, e.g., indium tin zinc oxide. Moreover, it may have a composition mainly composed of tin oxide, zinc oxide or the like other than indium oxide. When ITO is used, a more commonly used composition contains tin oxide at 5 to 10% by weight on indium oxide. An oxide semiconductor can be produced by sputtering, EB vapor deposition, ion plating or the like.

A transparent, electroconductive film based on $In_2O_3$—$SnO_2$ or $In_2O_3$—ZnO has a work function of 4.6 eV, which can be increased to 5.2 eV or so, when the film is treated with ultraviolet ray, ozone or oxygen plasma, etc.

A transparent, electroconductive film based on $In_2O_3$—$SnO_2$ will be polycrystalline, when produced by sputtering with the board heated to around 200° C. The polycrystalline film may have irregularities on the surface due to the grains, and is preferably ground. Alternately, the film is preferably produced in an amorphous state, and heated into a polycrystalline state.

The anode may be of a common electroconductive film, when the above-described hole injection layer is provided, because it no longer needs a material of high work function.

More specifically, the materials useful for the anode include metals, e.g., aluminum, indium, molybdenum, nickel and an alloy thereof; and inorganic materials, e.g., polysilicon, amorphous silicon, tin oxide, indium oxide and, indium tin oxide (ITO).

The other useful materials include organic materials, e.g., polyaniline and polythiophene, and an electroconductive ink, which can be formed into a film by a simple coating method. It is needless to say that the useful materials are not limited to the above. Moreover, they may be used either individually or in combination.

The material for the hole injection layer preferably has an adequate level of ionization potential to decrease an injection barrier with the anode and hole transport layer, and also preferably works to smoothen rough surfaces of an undercoat layer. More specifically, the useful materials include, but not limited to, copper phthalocyanine, starburst amine compound, polyaniline, polythiophene, vanadium oxide, molybdenum oxide, ruthenium oxide and aluminum oxide.

The hole transport layer works to transport holes and inject them into the light-emitting layer. Therefore, the hole transport layer is preferably made of a hole transport material of high hole mobility. The other characteristics which the material preferably has include high chemical stability, low ionization potential, low affinity for electrons and high glass transition temperature. More specifically, the useful materials include N,N'-bis(3-methylphenyl)-N,N'-diphenyl-[1,1'-biphenyl]-4,4'-diamine (TPD), 4,4'-bis[N-(1-naphthyl)-N-phenylamino]biphenyl (α-NPD), 4,4',4"-tri(N-carbozolyl)triphenylamine (TCTA), 1,3,5-tris[N-(4-diphenylaminophenyl) phenylamino]benzene (p-DPA-TDAB), 4,4',4"-tris(N-carbozole)triphenylamine (TCTA), 1,3,5-tris[N,N-bis(2-methylphenyl)-amino]benzene (o-MTDAB), 1,3,5-tris[N,N-bis(3-methylphenyl)-amino]benzene (m-MTDAB), 1,3,5-tris[N,N-bis(4-methylphenyl)-amino]benzene (p-MTDAB), 4,4',4"-tris[1-naphthyl(phenyl)amino]triphenylamine (1-TNATA), 4,4',4"-tris[2-naphthyl(phenyl)amino]triphenylamine (2-TNATA), 4,4',4"-tris[biphen-4-yl]-(3-methylphenyl)amino]triphenylamine (p-PMTDATA), 4,4',4"-tris[9,9-dimethylfluoren-2-yl(phenyl)amino]triphenylamine (TFATA), 4,4',4"-tris(N-carbozolyl)triphenylamine (TCTA), 1,3,5-tris{4-[methylphenyl(phenyl)amino]phenyl}benzene (MTDAPB), N,N'-di(biphen-4-yl)-N,N'-diphenyl[1,1'-biphenyl]-4,4'-diamine (p-BPD), N,N'-bis(9,9-dimethylfluoren-2-yl)-N,N'-diphenylfluorene-2,7-diamine (PFFA), N,N,N',N'-tetrakis(9,9-dimethylfluoren-2-yl)-[1,1-biphenyl]-4, 4'-diamine (FFD), (NDA)PP, and 4,4'-bis[N,N'-(3-tolyl) amino]3,3'-dimethylbiphenyl (HMTPD). It is needless to say that the useful materials are not limited to the above. Moreover, they may be used either individually or in combination.

The hole transport material for the hole transport layer is preferably incorporated with an oxidant to decrease a barrier with the anode or increase electroconductivity. More specifically, the oxidants useful for the present invention include Lewis acid compounds, e.g., ferric chloride, ammonium chloride, gallium chloride, indium chloride and antimony pentachloride; and electron acceptor compounds, e.g., trinitrofluorene. It is needless to say that the useful materials are not limited to the above. Moreover, they may be used either individually or in combination.

The light-emitting layer provides the site in which the injected holes and electrons are recombined with each other to emit light whose wavelength is peculiar to the material used. Light may be emitted from the host material itself for the light-emitting layer or a trace quantity of dopant incorporated in the host material. More specifically, the useful host materials include a distyrylarylene derivative (DPVBi), silol derivative with benzene ring as the skeleton (2PSP), oxodiazole derivative with triphenylamine structures at both ends (EM2), perinone derivative with phenanthlene group (P1), oligothiophene derivative with triphenylamine structures at both ends (BMA-3T), perylene derivative (tBu-PTC), tris(8-quinolinol) aluminum, polyparaphenylene vinylene derivative, polythiophene derivative, polyparaphenylene derivative, polysilane derivative and polyacetylene derivative. It is needless to say that the useful materials are not limited to the above. Moreover, they may be used either individually or in commination.

The dopants useful for the present invention specifically include quinacridone, coumarine 6, Nile Red, rubrene, 4-(dicyanomethylene)-2-methyl-6-(para-dimethylaminostyryl)-4H-pyran (DCM), a dicarbazole derivative, porphyrin-platinum complex (PtOEP) and iridium complex $(Ir(ppy)_3)$. It is needless to say that the useful materials are not limited to the above. Moreover, they materials may be used either individually or in combination.

The electron transport layer works to transport electrons and inject them into the light-emitting layer. More specifically, the useful materials for the layer include tris(8-quinolinol) aluminum, an oxodiazole derivative, silol derivative, zinc benzothiazole derivative and basocuproin (BCP).

The electron transport material for the electron transport layer is preferably incorporated with a reductant to decrease a barrier with the anode or increase electroconductivity. The reductants useful for the present invention specifically include an alkali metal, alkali-earth metal, alkali metal oxide, alkali-earth oxide, rare-earth oxide, alkali metal halide, alkali-earth halide, rare-earth halide, and complex of an alkali metal and aromatic compound. The particularly preferable alkali metals are Cs, Li, Na and K. It is needless to say that the useful materials are not limited to the above. Moreover, they may be used either individually or in combination.

The mixed light-emitting layer is composed of a hole and electron transport materials and dopant. The hole and electron transport materials and dopant useful for the present invention are specifically described earlier.

The hole and electron transport materials and dopant which constitute the mixed light-emitting layer preferably satisfy the following relationship:

$$I_{dop} < I_{EM\text{-}HTL} < I_{EM\text{-}ETL} \quad \text{(Formula 1)}$$

wherein,
$I_{dop}$: ionization potential of the dopant
$I_{EM\text{-}HTL}$: ionization potential of the hole transport material
$I_{EM\text{-}ETL}$: ionization potential of the electron transport material They also preferably satisfy the following relationship:

$$A_{EM\text{-}HTL} < A_{EM\text{-}ETL} < A_{dop} \quad \text{(Formula 2)}$$

$A_{dop}$: electron-affinity of the dopant
$A_{EM\text{-}HTL}$: electron-affinity of the hole transport material
$A_{EM\text{-}ETL}$: electron-affinity of the electron transport material When the relationship of Formula 1 is satisfied, rate of the holes injected into the mixed light-emitting layer is governed by the step of trapping them by the dopant and step of propagating them in the hole transport material.

When the relationship of Formula 2 is satisfied, rate of the electrons injected into the mixed light-emitting layer is governed by the step of trapping them by the dopant and step of propagating them in the electron transport material.

As a result, the dopant is excited by the holes and electrons it traps to release light having a light-emitting energy of $I_{dop}$-$A_{dop}$, and then returns back to the ground state.

Ionization potential means energy needed for taking one electron out of a substance. It is defined as work function, when the substance is a metal. It is determined by atmospheric or ultraviolet photoelectron spectroscopy.

Affinity for electrons means energy needed for donating one electron to a substance. It is determined by adding ionization potential to an energy gap found from the band end of an absorption spectral pattern, or inverse photoelectron spectroscopy.

Thickness of the mixed light-emitting layer can be within a range from 1 to 100 nm. It should be noted, however, that the carrier is trapped by the dopant in the mixed light-emitting layer, and increasing layer thickness decreases carrier transport capacity of the layer. Therefore, its thickness is preferably in a range from 1 to 10 nm.

The mixed light-emitting layer can be composed of 1 to 99% by weight of a hole transport material, 99 to 1% by weight of an electron transport material and 0.01 to 33% by weight of a dopant. It is preferably composed of 30 to 70% by weight of a hole transport material, 70 to 30% by weight of an electron transport material and 0.01 to 33% by weight of a dopant.

The methods for producing the mixed light-emitting layer include, but not limited to, vacuum deposition, spin coating, casting, printing and carrier gas transportation.

In the mixed light-emitting layer, holes and electrons move in a respective hole transport material and electron transport material of high transport capacity, and hence are injected into an adjacent mixed light-emitting layer, or adjacent mixed transport layer described later, while controlling degradation of each material.

The mixed transport layer described above is composed of a mixture of a hole transport and electron transport materials. The specific hole transport and electron transport materials are already described earlier.

The hole and electron transport materials which constitute the mixed transport layer preferably satisfy the following relationship:

$$I_{M\text{-}HTL} < I_{M\text{-}ETL}$$

wherein,
$I_{M\text{-}HTL}$: ionization potential of the hole transport material
$I_{M\text{-}ETL}$: ionization potential of the electron transport material They also preferably satisfy the following relationship:

$$A_{M\text{-}HTL} < A_{M\text{-}ETL} \quad \text{(Formula 4)}$$

$A_{M\text{-}HTL}$: electron-affinity of the hole transport material
$A_{M\text{-}ETL}$: electron-affinity of the electron transport material When the relationship of Formula 3 is satisfied, rate of the holes injected into the mixed transport layer is governed by the step of propagating them in the hole transport material.

When the relationship of Formula 4 is satisfied, rate of the electrons injected into the mixed transport layer is governed by the step of propagating them in the electron transport material.

As a result, the holes and electrons propagate in the mixed transport layer through the respective hole transport and electron transport materials, and the carriers are injected into the adjacent mixed light-emitting layer while controlling degradation of each material.

The mixed light-emitting layer can be 1 to 1000 nm thick, and the thickness is preferably in a range from 1 to 50 nm.

The mixed transport layer can be composed of 1 to 99% by weight of a hole transport material and 99 to 1% by weight of an electron transport material. The preferable composition is 10 to 90% by weight of a hole transport material and 90 to 10% by weight of an electron transport material.

The methods for producing the mixed transport layer include, but not limited to, vacuum deposition, spin coating, casting, printing and carrier gas transportation.

One embodiment of the organic light-emitting element of the present invention comprises 2 or more mixed light-emitting layers (hereinafter referred to as laminated type mixed light-emitting layer). First, the laminated type light-emitting layer comprising 2 mixed light-emitting layers is described, the one on the anode side being referred to as the first mixed light-emitting layer and the other on the cathode side to the second mixed light-emitting layer.

First, it is preferable that there is no energy barrier for hole injection in the interface between the first and second mixed light-emitting layers.

More specifically, the hole transport material for the first mixed light-emitting layer and that for the second mixed light-emitting layer preferably satisfy the following relationship:

$$I_{EM1\text{-}HTL} \geq I_{EM2\text{-}HTL} \quad \text{(Formula 5)}$$

wherein, $I_{EM1\text{-}HTL}$: ionization potential of the hole transport material for the first mixed light-emitting layer $I_{EM2\text{-}HTL}$: ionization potential of the hole transport material for the second mixed light-emitting layer Next, it is preferable that there is no energy barrier for electron injection in the interface between the first and second mixed light-emitting layers.

More specifically, the electron transport material for the first mixed light-emitting layer and that for the second mixed light-emitting layer preferably satisfy the following relationship:

$$A_{EM1\text{-}HTL} \geq A_{EM2\text{-}HTL} \quad \text{(Formula 6)}$$

wherein, $A_{M1\text{-}HTL}$: electron-affinity of the electron transport material for the first mixed light-emitting layer $A_{EM2\text{-}HTL}$: electron-affinity of the electron transport material for the second mixed light-emitting layer The layer for a laminated type mixed light-emitting layer composed of 3 or more layers preferably satisfies the relationships similar to those for a laminated structure composed of 2 layers. More specifically, the hole transport material for the mixed light-emitting layer has an ionization potential kept constant or decreasing as it goes from the anode to the cathode side. Similarly, the electron transport material for the mixed light-emitting layer has an affinity for electrons kept constant or decreasing as it goes from the anode to the cathode side.

When the above relationships are satisfied, there are no energy barriers for hole and electron injection in the interface between the light-emitting layers in the absence of voltage, and light can be emitted at a lower voltage, when it is applied.

The organic light-emitting element of the present invention has a laminated structure with a mixed transport layer placed between 2 mixed light-emitting layers. These layers are the first mixed light-emitting layer, first mixed transport layer and second mixed light-emitting layer, in this order, from the anode to the cathode.

These layers preferably satisfy the following relationship:

$$I_{EM1\text{-}HTL} \geq I_{MIX1\text{-}HTL} \geq I_{EM2\text{-}HTL} \quad \text{(Formula 7)}$$

wherein, $I_{EM1\text{-}HTL}$: ionization potential of the hole transport material for the first mixed light-emitting layer $I_{MIX1\text{-}HTL}$: ionization potential of the hole transport material for the first mixed transport layer $I_{EM2\text{-}HTL}$: ionization potential of the hole transport material for the second mixed light-emitting layer These layers also preferably satisfy the following relationship:

$$A_{EM1\text{-}ETL} \geq A_{MIX1\text{-}ETL} \geq A_{EM2\text{-}ETL} \quad \text{(Formula 8)}$$

wherein, $A_{EM1\text{-}ETL}$: electron-affinity of the electron transport material for the first mixed light-emitting layer $A_{MIX1\text{-}ETL}$: electron-affinity of the electron transport material for the first transport layer $A_{EM2\text{-}ETL}$: electron-affinity of the electron transport material for the second mixed light-emitting layer Another embodiment of the organic light-emitting element of the present invention is a laminated structure comprising at least one layer of mixed transport/light-emitting layer incorporated in the above-described embodiment having a mixed transport layer placed between 2 mixed light-emitting layers (hereinafter referred to as laminated type mixed light-emitting/transport layer). It is preferable, also in this embodiment, that the laminated structure satisfies the similar relationships. More specifically, the mixed light-emitting layer or mixed transport layer has an ionization potential kept constant or decreasing as it goes from the anode to the cathode side, and similarly has an affinity for electrons kept constant or decreasing as it goes from the anode to the cathode side.

When the above relationships are satisfied, there are no energy barriers for hole and electron injection in the interface between the mixed light-emitting layer and mixed transport layer in the absence of voltage, and light can be emitted at a lower voltage, when it is applied.

In order to emit white light as one of the objects of the present invention, it is preferable to incorporate the light-emitting element in a 3-color system in which a mixture of wavelengths for red, green and blue colors is emitted, or in a complementary color system in which a mixture of wavelengths for blue and yellow colors or blue green and orange colors is emitted.

The laminated type light-emitting layer preferably satisfies the relationships of Formulae 5 and 6. The light-emitting energy of emitted light is represented by $I_{dop}\text{-}A_{dop}$. Based on these relationships coupled with the relationships of Formulae 1 and 2, a mixed light-emitting layer emitting light of higher light-emitting energy, e.g., blue color, is preferably located closer to the anode side than that emitting light of lower light-emitting energy, e.g., yellow to red color.

In the organic light-emitting element of the laminated structure of the present invention comprising 2 mixed light-emitting layers or a mixed transport layer placed between 2 mixed light-emitting layers, the first mixed light-emitting layer located on the anode side or second mixed light-emitting layer on the cathode side preferably has a higher dopant content than the other, whichever has a higher mobility with respect to holes in the hole transport layer for the first layer or to electrons in the electron transport layer for the second layer.

The mobility is a property which represents mobility of carriers being conducted between organic molecules. It may be determined by the Time-of-Flight (TOF) method, in which a sample to which a voltage is applied is irradiated with pulsed light to determine mobility by measuring photoelectric current resulting from movement of the carriers.

The mixed light-emitting layer for the present invention traps carriers by the dopant contained therein. Consequently, increasing a dopant content of the light-emitting layer, which comprises a transport material of high mobility, enhances a charge balance in the layer and hence its light-emitting efficiency.

It is preferable that the electrons running through the light-emitting layer and the hole transport layer are blocked in the interface between them. More specifically, these layers preferably satisfy the following relationship:

$$A_{EM\text{-}ETL} < A_{HTL}$$

wherein, $A_{EM\text{-}ETL}$: electron-affinity of the electron transport material of the mixed light-emitting layer adjacent to the hole transport layer $A_{HTL}$: electron-affinity of the hole transport of the hole transport layer It is also preferable that the holes running through the light-emitting layer and electron transport layer are blocked in the interface between them. More specifically, these layers preferably satisfy the following relationship:

$$I_{EM\text{-}HTL} < I_{ETL} \quad \text{(Formula 10)}$$

wherein, $I_{EM\text{-}HTL}$: ionization potential of the hole transport material of the mixed light-emitting layer adjacent to the electron transport layer $I_{ETL}$: ionization potential of the electron transport material of the electron transport layer The energy diagrams as described by Formulae 1-10 are illustrated in FIGS. 21A-21 E.

The electron injection layer is provided to enhance electron injection efficiency from the cathode into the electron transport layer. The preferable materials for the electron injection layer include lithium fluoride, magnesium fluoride, calcium fluoride, strontium fluoride, barium fluoride, magnesium oxide and aluminum oxide. However, it is needless to say that the preferable materials are not limited to the above. Moreover, they may be used either individually or in combination.

The cathode is preferably in the form of electroconductive film of low work function to enhance electron injection efficiency. More specifically, the preferable materials for the cathode include, but not limited to, magnesium/silver alloy, aluminum/lithium alloy, aluminum/calcium alloy, aluminum/magnesium alloy and metallic calcium.

The cathode may not be necessarily of a material of low work function, when the electron injection layer is provided, and may be of a common metallic material. More specifically, the preferable materials in the above case include metals, e.g., aluminum, indium, molybdenum and nickel; alloys thereof; and polysilicon and amorphous silicon.

The protective layer is provided on the second electrode, to prevent $H_2O$ and $O_2$ in air from entering the second electrode or organic layer below the second electrode.

The preferable materials for the protective layer include, but not limited to, inorganic materials, e.g., $SiO_2$, SiNx and $Al_2O_3$; and organic materials, e.g., chloropyrene, polyethylene terephthalate, polyoxymethylene, polyvinyl chloride, polyvinylidene fluoride, cyanethyl pullulan, polymethyl methacrylate, polysulfone, polycarbonate and polyimide.

The organic light-emitting element of the present invention is provided with the light-reflecting electrode. Consequently, light emitted from the mixed light-emitting layer shows interference by light directly emitted from the light-emitting electrode and light reflected by the light-reflecting electrode before being emitted from the light-emitting electrode.

The light interference is discussed first by taking as an example the laminated layer of 2 mixed light-emitting layers. When the first mixed light-emitting layer satisfies the following relationship, then the positive interference condition is realized to increase intensity of light emitted from the light-emitting electrode:

$$L_1 = (m+1/2) \times \lambda_1 \quad \text{(Formula 11)}$$

wherein, $L_1$: length twice as long as the light path length from the light-emitting point in the first mixed light-emitting layer to the light-reflecting layer, where the light path length is defined as the sum of thickness of each layer involved in the light path length multiplied by its refractive index $\lambda_1$: central wavelength of light emitted from the mixed light-emitting layer on the light-reflecting electrode side, i.e., the first mixed light-emitting layer m: integer Next, when the second mixed light-emitting layer satisfies the following relationship, then the positive interference condition is realized to increase intensity of light emitted from the light-emitting electrode:

$$L_2 = (n+1/2) \times \lambda_2 \quad \text{(Formula 12)}$$

wherein, $L_2$: length twice as long as the light path length from the light-emitting point in the second mixed light-emitting layer to the light-reflecting layer, $\lambda_2$: central wavelength of light emitted from the second mixed light-emitting layer A relationship $\lambda_1 < \lambda_2$ preferably holds when m=n, knowing that $L_1$ is shorter than $L_2$. In other words, the color emitted from the mixed light-emitting layer closer to the light-emitting electrode has a longer central wavelength than that closer to the light-reflecting electrode.

In the above explanation, only the interference effect by light reflected by the light-reflecting electrode is considered. In actuality, however, the interface between the light-emitting electrode or protective layer and inert gas or air layer above reflects light. It is therefore necessary to take into consideration the interference effect by the interface. It is preferable, also in the above case, that light emitted from the mixed light-emitting layer closer to the light-emitting electrode has a longer central wavelength than that emitted from the mixed light-emitting layer closer to the light-reflecting electrode.

The organic light-emitting element of the present invention preferably comprises an anode and cathode each in the form of light-transmittable, electroconductive film, and also has a structure with one of the above electrodes working as a light-emitting electrode and the other as a light-transmitting electrode, wherein a diffuse reflection layer is provided on the outside of the light-transmitting layer, and light which is emitted from at least one organic layer placed between the anode and cathode and is transmitted by the light-transmitting electrode is reflected by the diffuse reflection layer towards the light-emitting electrode.

The diffuse reflection layer has a structure with micron-order surface irregularities, which are preferably coated with a metal of high reflectance. The organic light-emitting element is formed on the diffuse reflection layer, and a transparent flattening layer is preferably provided between the diffuse reflection layer and organic light-emitting element.

The at least one organic layer has one of the above-described structures (1), (2) and (3), and preferably has additional 2 or more laminated light-emitting layers.

The organic light-emitting display device of the present invention preferably uses the above organic light-emitting element as the pixel. It also preferably uses a color-converting layer.

The organic light-emitting display device means a device which uses the organic light-emitting element as the pixel. The organic light-emitting display devices falls into two types, one being a simple matrix type and the other active matrix type.

The simple matrix type device has organic light-emitting layers, e.g., hole transport, light-emitting and electron transport layers, positioned at the intersections of anode lines with cathode lines, and each pixel is on only for a selected time in one frame period. Selected time is a time span of one frame period divided by number of the anode lines.

In an active matrix type device, on the other hand, 2 to 4 driving elements, each composed of a switching element of thin-film transistor and capacitor, are connected to the organic EL (light-emitting) element which constitutes a pixel. As a result, all pixels can be on in a frame period to extend service life of the organic light-emitting element, because necessity for increasing brightness is removed.

A number of pixels are positioned on the display device screen, each serving as the smallest unit responsible for displaying letters and graphics on the display region. The pixel is divided into the sub-pixels, each serving as the smallest unit for a color display device, which generally has a structure with the sub-pixels for green, red and blue colors. The display region means a region on which images are displayed in a display device.

The color-converting layer means a layer which converts light emitted from an organic light-emitting element serving as a pixel or sub-pixel into light of another color.

The color-converting layer structure falls into two types, one being provided on the organic light-emitting element and the other on the opposed board.

In the former structure, the color-converting layer is provided on the organic light-emitting element serving as a pixel or sub-pixel directly or via a protective layer. A black matrix is provided between the pixels or sub-pixels, to prevent the color-converting layer from emitting light when irradiated with light from the adjacent pixel or sub-pixel. Order of forming the black matrix and color-converting layer is not specified. A protective layer is provided, as required.

In the latter structure, the black matrix, color-converting layer and protective layer are provided on the opposed board, and the resulting laminate is put on an organic EL board in such a way to position the given color-converting layer on the pixel or sub-pixel.

The color-converting layer broadly falls into two types, one being a color filter layer and the other being color-converting layer.

The color filter layer emits part of the spectra of light entering thereinto. It contains a colorant and binder resin, and the colorant may be red, blue or green one, among others.

The specific red colorants include pigments based on perylene, lake, azo, quinacridone, anthracene, isoindoline and isoinodolinone. It is needless to say that the useful colorants are not limited to the above. Moreover, they may be used either individually or in combination.

The specific blue colorants include pigments based on copper phthalocyanine, indanthrone, indophenol, cyanine and dioxazin. It is needless to say that the useful colorants are not limited to the above. Moreover, they may be used either individually or in combination.

The specific green colorants include a coumarine-based pigment.

The preferable material for the binder resin is transparent and has a transmittance of 50% or more in the visible region. More specifically, the preferable materials include polymethyl methacrylate, polyacrylate, polycarbonate, polyvinyl alcohol, polyvinyl pyrrolidone, hydroxyethyl cellulose and carboxyethyl cellulose. It is needless to say that the useful materials are not limited to the above. Moreover, they may be used either individually or in combination.

The methods for producing the color filter include, but not limited to, dyeing, pigment dispersion, printing and electrodeposition.

The color-converting layer comprises a color-converting fluorescent layer which is excited by incident light to emit fluorescent light, and correcting color filter which corrects spectra of light to be emitted.

The color-converting fluorescent layer contains a fluorescent colorant and binder resin. The useful fluorescent colorants include red and green ones.

The specific red fluorescent colorants include cyanine-based ones, e.g., 4-dicyanomethylene-2-methyl-6-(p-dimethylaminostyryl)-4H-pyran; pyridine-based ones, e.g., 1-ethyl-2-[4-(p-dimethylaminophenyl)-1,3-butadienyl]-pyridium-perchlorate; rhodamine-based ones, e.g., rhodamine B and rhodamine 6G; and oxazin-based ones. It is needless to say that the useful colorants are not limited to the above. Moreover, they may be used either individually or in combination.

The specific green fluorescent colorants include coumarine-based colorants, e.g., 2,3,5,6-1H,4H-tetrahydro-8-trifluoromethylquinolidino(9,9a,1-gh)coumarine, 3-(2'-benzothiazolyl)-7-dimethylaminocoumarine and 3-(2'-benzimidazolyl)-7-N,N-diethylaminocoumarine; and coumarine colorant-based dyes, e.g., basic yellow. It is needless to say that the useful colorants are not limited to the above. Moreover, they may be used either individually or in combination.

Other objects, features and advantages of the invention will become apparent from the following description of the embodiments of the invention taken in conjunction with the accompanying drawings.

BRIEF DESCRIPTION OF THE DRAWINGS

FIG. 14 is a cross-sectional view illustrating one embodiment of the organic light-emitting image display device (prepared in EXAMPLE 13).

FIGS. 21A-21E illustrate energy diagrams as described in Formulae 1-10.

DESCRIPTION OF REFERENCE NUMERALS

Figure 1:
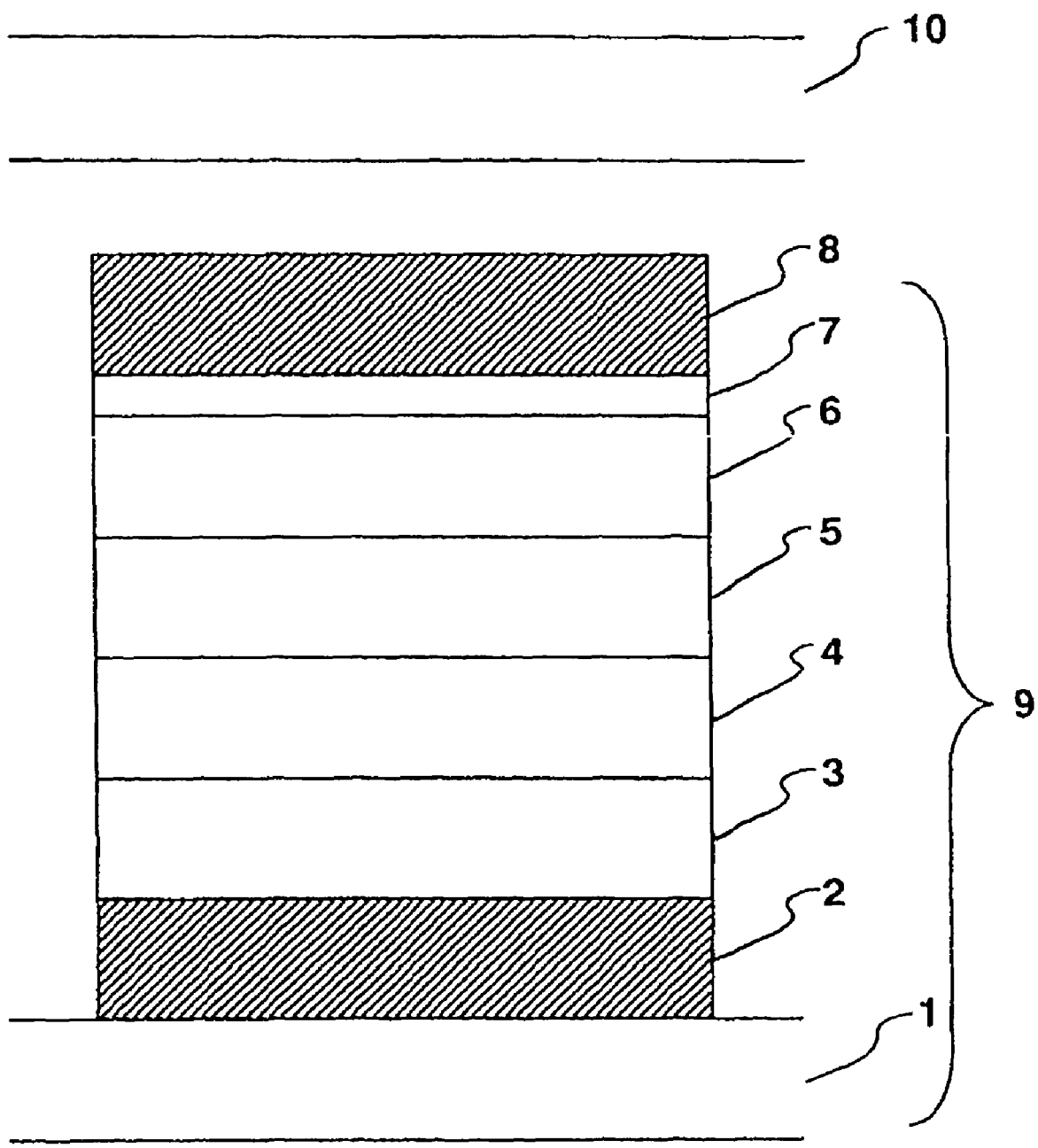
FIG. 1 illustrates one embodiment of the organic light-emitting element (prepared in EXAMPLE 1).

1, 116, 201: Glass board
2, 150: Lower electrode
3, 15: Hole transport layer
4: First mixed light-emitting layer
5: Second mixed light-emitting layer
6, 18: Electron transport layer
7: Electron injection layer
8: Upper electrode
9: Organic EL board
10: Sealing board
11: Mixed transport layer
12: First mixed transport layer
13: Second mixed transport layer
14: Third mixed transport layer
16: First block layer
17: Second block layer
19: Diffuse reflection layer
20: Interlayer insulation layer
21: First light-emitting layer
22: Second light-emitting layer
101: First transistor
102: Second transistor
103: Active layer for the first transistor 101
103': Active layer for the second transistor 102
104: Capacitor
105: Lower electrode for the capacitor
106: Scanning line
107, 107': Gate electrode
108: Upper electrode for the capacitor
109: Signal line
110: First current supply line
112: Source electrode for the first transistor 101
112': Source electrode for the second transistor 102
113: Drain electrode for the first transistor 101
113': Drain electrode for the second transistor 102
117, 205: Gate insulation film
118: First interlayer insulation film
119: Second interlayer insulation film
151: Third interlayer insulation film
152: Organic layer
153: Upper electrode
154: TFT board
161: Opposed board
162, 252: Black matrix (BM) layer
163a: Red-coloring layer
163b: Green-coloring layer
163c: Blue-coloring layer
164: Protective layer
165: Inert gas atmosphere
166: Sealant
167a: Color-converting layer for red
167b: Color-converting layer for green
168: Diffuse reflection section
202: Common electrode
203: Scanning signal electrode
204: Alumina film
207: Amorphous Si film
207: N-type a-Si film
208: Image signal electrode
209: Pixel electrode
210: Protective film
211, 255: Oriented film
251: Opposed board
253: Color filter layer
254: Protective layer for the color filter
256: Liquid-crystal layer
300: Illuminator
301: Light diffuse sheet

DETAILED DESCRIPTION OF THE INVENTION

The preferred embodiments of the present invention are described below.

Example 1

First, one embodiment of the laminated layer comprising 2 mixed light-emitting layers is described by referring to FIG. 1, wherein 1: glass board, 2: lower electrode, 3: hole transport layer, 4: first mixed light-emitting layer, 5: second mixed light-emitting layer, 6: electron transport layer, 7: electron injection layer, 8: upper electrode, 9: organic EL board, and 10: sealing board.

A 150 nm thick ITO film was formed on the glass board 1 by sputtering, and was treated by photolithography to form the lower electrode 2.

Next, the lower electrode 2 was coated with a 50 nm thick film of 4,4-bis[N-(1-naphthyl)-N-phenylamino]biphenyl (hereinafter referred to as α-NPD) by vacuum deposition.

A starting material for α-NPD, put in a sublimation boat of molybdenum, was deposited on the lower electrode 2, where the deposition rate was controlled at 0.15±0.01 nm/second. The α-NPD film worked as the hole transport layer 3.

Next, the hole transport layer 3 was coated with a 5 nm thick film of 4,4'-bis[N,N'-(3-tolyl)amino]-3-3'-dimethylbiphenyl (hereinafter referred to as HMTPD), basocuproin (hereinafter referred to as BCP) and 1,4'-bis[N-(3-methylphenyl)-N'-phenyl-4-aminophenylvinylene]-2,5-dimethoxybenzene (hereinafter referred to as DSA) as a styrylamine compound, codeposited under a vacuum.

Starting materials for HMTPD, BCP and DSA, each put in a sublimation board of molybdenum, were codeposited under a vacuum, where the deposition rates were controlled at 0.20±0.01, 0.20±0.01 and 0.01±0.005 nm/second, respectively. The codeposited film worked as the first mixed light-emitting layer 4. Moreover, DSA worked as a dopant which determined emitted light color in the layer 4.

Next, the first mixed light-emitting layer 4 was coated with a 5 nm thick film of α-NPD, tris(8-quinolinol)aluminum (hereinafter referred to as Alq3) and rubrene, codeposited under a vacuum.

Starting materials for α-NPD, Alq3 and rubrene, each put in a sublimation board of molybdenum, were codeposited under a vacuum, where the deposition rates were controlled at 0.20±0.01, 0.20±0.01 and 0.01±0.005 nm/second, respectively. The codeposited film worked as the second mixed light-emitting layer 5. Moreover, rubrene worked as a dopant which determined emitted light color in the layer 5.

Next, the second mixed light-emitting layer 5 was coated with a 20 nm thick Alq3 film by vacuum deposition, where a starting material for Alq3, put in a sublimation boat of molybdenum, was deposited and the deposition rate was controlled at 0.15±0.01 nm/second. The Alq3 film worked as the electron transport layer 6.

Next, a LiF film was formed to a thickness of 0.5 nm as the electron injection layer 7 on the electron transport layer 6 by vacuum deposition, where the deposition rate was controlled at 0.05±0.01 nm/second.

Next, an Al film was formed to a thickness of 150 nm as the upper electrode 8 on the electron injection layer 7 by vacuum deposition, where the deposition rate was controlled at 1±0.05 nm/second.

Next, the board (organic EL board) 9 on which the organic light-emitting layer was formed was transferred into a sealing chamber kept at a dew point of −90° C. or less, while it was held in a flow of circulating dry nitrogen gas to prevent exposure to air.

Next, a glass board to work as the sealing board (opposed board) 10 was transferred into the sealing chamber, and a photocurable resin was drawn on the glass board (sealing board) edges by a seal dispenser (not shown).

The sealing width of the photocurable resin was kept at 200 µm. The resin was incorporated with glass beads (diameter: 10 µm) at 1% by weight. The sealing board was pressed to the organic EL board 9 under a load of 0.5 kg/cm$^2$ in the sealing chamber. The photocurable resin was cured with UV directed onto the sealing board 10 after a light-shielding plate was placed on the outer surface of the board 10 to prevent exposure of the whole light-emitting element body to UV not shown).

The process of light emission by the organic light-emitting element of this embodiment is described. A voltage of light emission initiation level or higher was applied to between the lower electrode 2 and upper electrode 8.

First, the hole transport process is described. Holes are injected from the ITO electrode as the lower electrode 2 into the first mixed light-emitting layer 4 via the hole transport layer 3. HMTPD and BCP as the materials constituting the first mixed light-emitting layer 4 have an ionization potential of 5.6 and 6.4 eV, respectively. Consequently, the holes injected into the hole transport layer 3 preferentially run through HMTPD as the hole transport material. At the same time, part of the holes are trapped by DSA as the dopant in the first mixed light-emitting layer 4.

Next, the holes running through the HMTPD are injected into the second mixed light-emitting layer 5. α-NPD and Alq3 as the materials constituting the second mixed light-emitting layer 5 have an ionization potential of 5.3 and 5.7 eV, respectively. Consequently, the holes preferentially run through α-NPD. Moreover, HMTPD has a higher ionization potential than α-NPD, and there is no energy barrier for hole injection from the first mixed light-emitting layer 4 into the second mixed light-emitting layer 5 in the absence of voltage between the electrodes. Still more, Alq3 constituting the electron transport layer 6 has a higher ionization potential than α-NPD, and consequently the holes remain in the second mixed light-emitting layer 5.

Next, the electron transport process is described. Electrons are injected from the upper electrode 8 to the electron injection layer 7 and electron transport layer 6, in this order. The electrons run through the electron transport layer 6 into the second mixed light-emitting layer 5. α-NPD and Alq3 as the materials constituting the second mixed light-emitting layer 5 have an affinity for electron of 2.5 and 2.9 eV, respectively. Consequently, the electrons preferentially run through Alq3 as the electron transport material. At the same time, part of the electrons are trapped by rubrene working as a dopant in the second mixed light-emitting layer 5.

The electrons running through Alq3 are injected into the first mixed light-emitting layer 4. HMTPD and BCP as the materials constituting the first mixed light-emitting layer 4 have an affinity for electron of 2.3 and 2.9 eV, respectively. Consequently, the injected electrons preferentially run through BCP as the electron transport material. Alq3 and BCP have the same affinity for electron, and consequently there is no energy barrier for electron injection from the second mixed light-emitting layer 5 into the first mixed light-emitting layer 4 in the absence of voltage between the electrodes. Moreover, α-NPD as the material constituting the hole transport layer 3 has a lower affinity for electron than BCP, and consequently the electrons are not injected into the hole transport layer 3 but remain in the first mixed light-emitting layer 4.

Next, the light-emitting process is described. In the first mixed light-emitting layer 4, the electrons running through BCP are trapped by DSA as the dopant, which has already trapped the holes, with the result that DSA is excited. Then, it emits light of a wavelength which corresponds to the differential energy between the first excited state and ground state to return back to the ground state. There are other light-emitting mechanisms by DSA, when it is excited by holes after it traps electrons, and by holes and electrons simultaneously trapped, to emit light and return back from the excited state to the ground state.

In the second mixed light-emitting layer 5, on the other hand, the holes running through α-NPD are trapped by rubrene as the dopant, which has already trapped the electrons, with the result that rubrene is excited. Then, it emits light of a wavelength which corresponds to the differential energy between the first excited state and ground state to return back to the ground state. There are other light-emitting mechanisms by rubrene, when it is excited by electrons after it traps holes, and by holes and electrons simultaneously trapped, to emit light.

To summarize, holes run through HMTPD and α-NPD as the hole transport materials, and electrons run through Alq3 and BCP as the electron transport materials. Consequently, degradation of each transport material for the mixed light-emitting layer is controlled to improve reliability of the element.

The organic element of this embodiment of the present invention emitted white light with light having a central wavelength of 480 nm and light having a central wavelength of 560 nm overlapping each other. It attained a brightness of 1000 cd/m$^2$, when a voltage of 8 V was applied thereto. The element having an initial brightness of 1000 cd/m$^2$ also showed a good service life of around 3000 hours as half-life, when driven at a constant current.

In this embodiment, the mixed light-emitting layers 4 and 5 are designed to have a thickness of 6 nm. No problem is anticipated when the thickness is increased. It should be noted, however, that increasing the thickness expands the dopant-containing region responsible for trapping carries, which is accompanied by reduced capacity of transporting carriers to the adjacent mixed light-emitting layer.

Moreover, the element of this embodiment was designed to have no energy barrier for both hole and electron injection in the interface between the mixed light-emitting layers 4 and 5 in the absence of voltage between the electrodes. However, no problem is anticipated when an energy barrier is provided for holes or electrons to have balanced carrier injection.

Example 2

Figure 2:
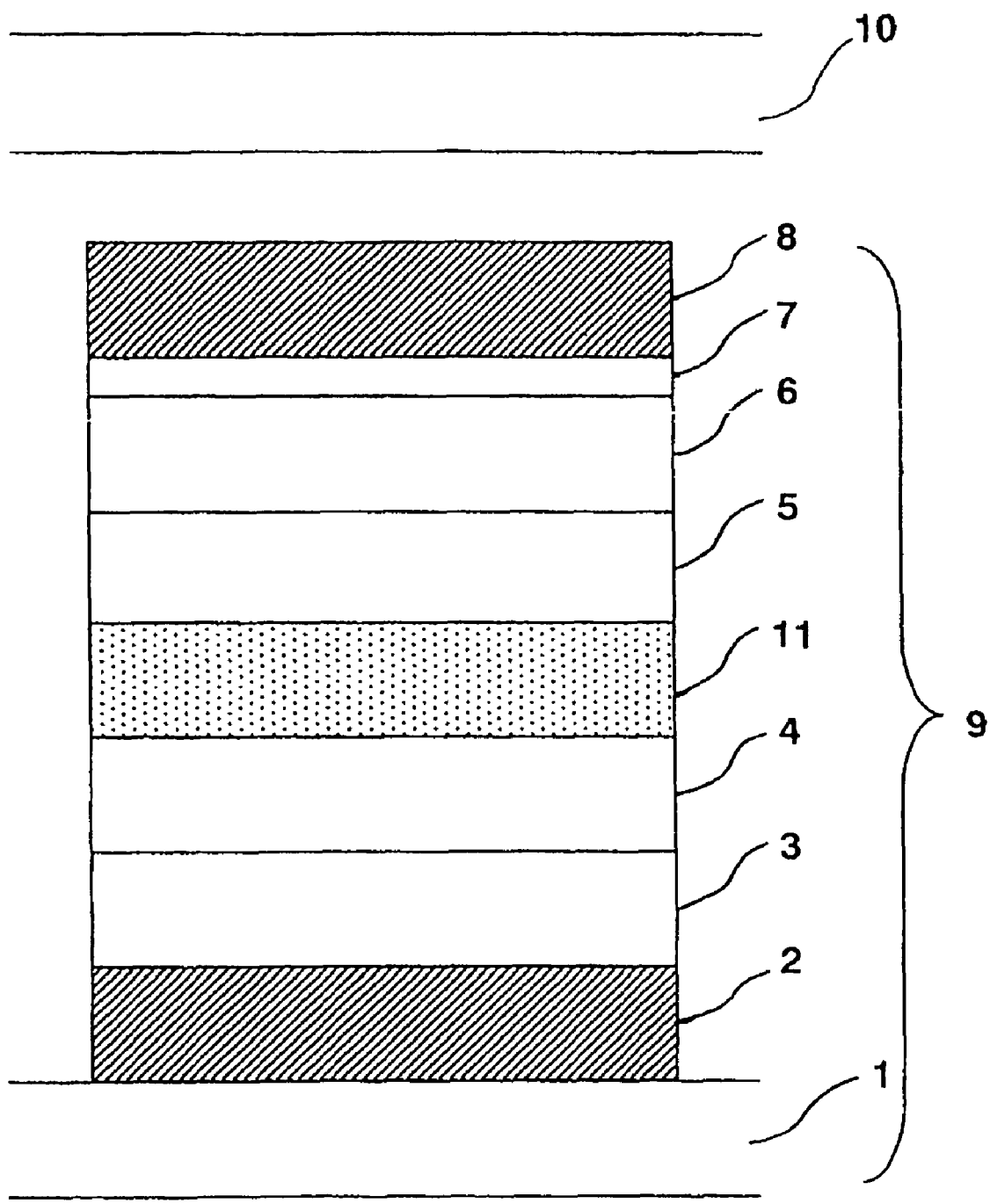
FIG. 2 illustrates another embodiment of the organic light-emitting element (prepared in EXAMPLE 2).

Next, another embodiment of the laminated layer with a mixed transport layer placed between 2 mixed light-emitting layers is described by referring to FIG. 2, wherein 11: mixed transport layer.

A 150 nm thick Cr film was formed on the glass board 1 by sputtering, and was treated by photolithography to form the lower electrode 2.

The lower electrode 2 was coated with the hole transport layer 3 and first mixed light-emitting layer 4 in the same manner as in EXAMPLE 1.

Next, the first mixed light-emitting layer 4 was coated with a 15 nm thick codeposited film of HMTPD and BCP by vacuum deposition on. Starting materials for HMTPD and BCP, each put in a sublimation boat of molybdenum, were codeposited, where the deposition rate was controlled at 0.20±0.01 nm/second for these materials. The codeposited film worked as the mixed transport layer 11.

Next, the mixed transport layer 11 was coated with the second mixed light-emitting layer 5 in the same manner as in EXAMPLE 1.

The mixed transport layer 11 was then coated with a 5 nm thick codeposited film of α-NPD, Alq3 and rubrene in the same manner as in EXAMPLE 1. The codeposited film worked as the second mixed light-emitting layer 5.

Next, the second mixed light-emitting layer 5 was coated with the electron transport layer 6 in the same manner as in EXAMPLE 1.

Next, the electron transport layer 6 was coated with a 10 nm thick mixed Mg/Ag layer by vacuum deposition (2-element simultaneous deposition), where the deposition rates were controlled at 0.14±0.01 and 0.01±0.005 nm/second, respectively. The mixed Mg/Ag layer worked as the electron injection layer 7.

Next, the electron injection layer 7 was coated with an 80 nm thick In—Zn—O (hereinafter referred to as IZO) film by sputtering. This film worked as the upper electrode 8 and was amorphous. The sputtering was carried out under conditions of atmosphere: Ar/O$_2$ mixed gas, degree of vacuum: 0.2 Pa and sputtering output: 2 W/cm$^2$, with In/(In+Zn) (=0.83) as the target. The resulting Mg/Ag/In—Zn—O laminated film had a transmittance of 65%.

Next, the organic EL board 9 was sealed by the sealing board 10 under the same conditions as used in EXAMPLE 1.

In the organic element prepared in EXAMPLE 2, like that prepared in EXAMPLE 1, holes run through HMTPD and α-NPD as the hole transport materials, and electrons run through Alq3 and BCP as the electron transport materials. It involves, also like that prepared in EXAMPLE 1, the light-emitting process in which carriers are trapped by rubrene as the dopant in the first mixed light-emitting layer 4. Degradation of each transport material for the mixed light-emitting layer is controlled to improve reliability of the element.

Moreover, the organic element was designed to have no energy barrier for both hole and electron injection in the interface between the mixed light-emitting layer 4 and mixed transport layer 11 in the absence of voltage between the electrodes. Consequently, it can emit light at a lower voltage.

The organic light-emitting element of this embodiment emits white light, which is a mixture of blue light emitted from the first mixed light-emitting layer 4 and yellow light emitted from the second mixed light-emitting layer 5. Blue light emitted from the first mixed light-emitting layer 4 is emitted from the element after following one of the routes described below. Light interference occurs in each route to change central wavelength and intensity of emitted light.

First mixed light-emitting layer→mixed transport layer→second mixed light-emitting layer→electron transport layer→electron injection layer→upper electrode First mixed light-emitting layer→hole transport layer→(reflected by the lower electrode)→hole transport layer→first mixed light-emitting layer→mixed transport layer→second mixed light-emitting layer→electron transport layer→electron injection layer→upper electrode First mixed light-emitting layer→mixed transport layer→second mixed light-emitting layer→electron transport layer→electron injection layer→upper electrode→(reflected by the sealing atmosphere)→upper electrode→electron injection layer→electron transport layer→second mixed light-emitting layer→mixed transport layer→first mixed light-emitting layer→hole transport layer→(reflected by the lower electrode)→hole transport layer→first mixed light-emitting layer→mixed transport layer→second mixed light-emitting layer→electron transport layer→electron injection layer→upper electrode Yellow light emitted from the second mixed light-emitting layer 5 is emitted from the element also after following one of the routes described below, and light interference occurs in each route to change central wavelength and intensity of emitted light.

Second mixed light-emitting layer→electron transport layer→electron injection layer→upper electrode Second mixed light-emitting layer→mixed transport layer→first mixed light-emitting layer→hole transport layer→(reflected by the lower electrode)→hole transport layer→first mixed light-emitting layer→mixed transport layer→second mixed light-emitting layer→electron transport layer→electron injection layer→upper electrode Second mixed light-emitting layer→electron transport layer→electron injection layer→upper electrode→(reflected by the sealing atmosphere)→upper electrode→electron injection layer→electron transport layer→second mixed light-emitting layer→mixed transport layer→first mixed light-emitting layer→hole transport layer→(reflected by the lower electrode)→hole transport layer→first mixed light-emitting layer→mixed transport layer→second mixed light-emitting layer→electron transport layer→electron injection layer→upper electrode The layered structure and thickness of each layer in the organic light-emitting element of this embodiment provide a positive condition for interference of blue light emitted from the first mixed light-emitting layer 4. Moreover, the 15 nm thick mixed transport layer 11 formed between the first mixed light-emitting layer 4 and second mixed light-emitting layer 5 also provides a positive condition for interference of yellow light emitted from the second mixed light-emitting layer 5, to increase light intensity. In the layered structure with the first mixed light-emitting layer 4 and second mixed light-emitting layer 5 positioned adjacent to each other, the former emitting blue light and the latter yellow light, yellow light emitted from the second mixed light-emitting layer 5 comes close to a negative light interference condition to damp light intensity to around 0.88.

The organic element of this embodiment of the present invention emitted white light with light having a central wavelength of 480 nm and light having a central wavelength of 560 nm overlapping each other. It attained a brightness of 1000 cd/m$^2$, when a voltage of 7 V was applied thereto. The element having an initial brightness of 1000 cd/m$^2$ also showed a good service life of around 3000 hours as half-life, when driven at a constant current.

Moreover, the organic element of this embodiment of the present invention is characterized by the mixed transport layer which separates the light-emitting region and transport region from each other. This allows the whole organic layer to have an increased thickness without increasing thickness of the first or second mixed light-emitting layer 4 or 5 working as the light-emitting region, and prevents short-circuit between the anode and cathode to improve reliability of the element.

Moreover, this embodiment formed the first mixed light-emitting layer 4 emitting a blue color at a position close to the lower electrode 2 working as the light-reflecting electrode, and the second mixed light-emitting layer 5 emitting a yellow color at a position close to the upper electrode 2 working as the light-emitting electrode. However, the mixed layer emitting a blue color and that emitting a yellow color may be positionally reversed in an element structure etc. which is not affected by light interference, described later.

Moreover, the element of this embodiment was designed to have no energy barrier for both hole and electron injection in the interface between the first mixed light-emitting layers 4 and mixed transport layer 11 and between the mixed transport layer 11 and second mixed light-emitting layer 5 in the absence of voltage between the electrodes. Consequently, it can emit light at a lower voltage. It should be noted, however, that presence of an energy barrier in the above interface is advantageous in some cases when balance between hole and electron injection is collapsed.

Example 3

Figure 3:
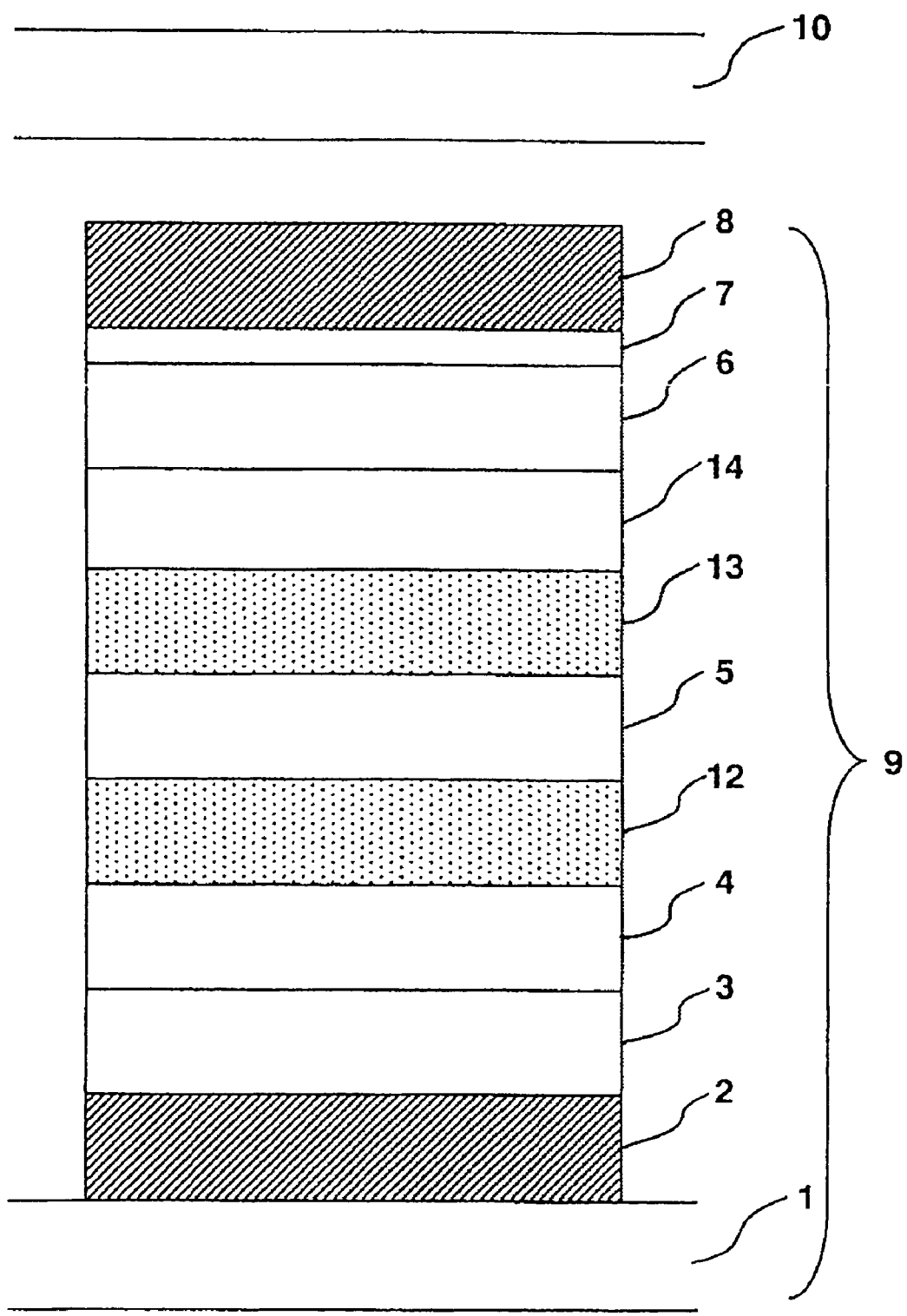
FIG. 3 illustrates still another embodiment of the organic light-emitting element (prepared in EXAMPLE 3).

Next, still another embodiment of the laminated layer having 3 mixed light-emitting layers with 2 mixed transport layers each placed between the mixed light-emitting layers is described by referring to FIG. 3, wherein 12: first mixed transport layer, 13: second mixed light-emitting layer and 14: third mixed light-emitting layer.

The glass board 1 was coated with the lower electrode 2, hole transport layer 3 and the first mixed light-emitting layer 4 in the same manner as in EXAMPLE 1.

Next, the first mixed light-emitting layer 4 was coated with a 15 nm thick codeposited film of HMTPD and BCP by vacuum deposition. Starting materials for HMTPD and BCP, each put in a sublimation boat of molybdenum, were codeposited, where the deposition rate was controlled at 0.20±0.01 nm/second for these materials. The codeposited film worked as the first mixed transport layer 12.

Next, the first mixed transport layer 12 was coated with a 5 nm thick codeposited film of α-NPD, Alq3 and coumarine 6 by vacuum deposition. Starting materials for α-NPD, Alq3 and coumarine 6, each put in a sublimation board of molybdenum, were deposited, where the deposition rates were controlled at 0.20±0.01, 0.20±0.01 and 0.01±0.005 nm/second, respectively. The codeposited film worked as the second mixed light-emitting layer 5.

Next, the second mixed light-emitting layer 5 was coated with a 15 nm thick codeposited film of α-NPD and Alq3 by vacuum deposition. Starting materials for α-NPD and Alq3, each put in a sublimation boat of molybdenum, were deposited, where the deposition rate was controlled at 0.20±0.01 nm/second for these materials. The codeposited film worked as the second mixed transport layer 13.

Next, the second mixed transport layer 13 was coated with a 5 nm thick codeposited film of α-NPD, Alq3 and DCM2. Starting materials for α-NPD, Alq3 and DCM2, each put in a sublimation boat of molybdenum, were deposited, where the deposition rates were controlled at 0.20±0.01, 0.20±0.01 and 0.008±0.002 nm/second, respectively. The codeposited film worked as the third mixed light-emitting layer 14.

Next, the third mixed light-emitting layer 14 was coated with the electron transport layer 6, electron injection layer 7 and upper electrode 8 in the same manner as in EXAMPLE 1.

Next, the organic EL board 9 was sealed by the sealing board 10 under the same conditions as used in EXAMPLE 1.

In the organic light-emitting element of this embodiment, the first mixed light-emitting layer 4, second mixed light-emitting layer 5 and third mixed light-emitting layer 14 emits light by the dopant in each layer after it traps holes and electrons.

Each of the mixed light-emitting layers containing the dopant which traps carriers was made thinner to 5 nm. Moreover, the first mixed transport layer 12 was placed between the first mixed light-emitting layer 4 and second mixed light-emitting layer 5, and the second hole transport layer 13 between the second mixed light-emitting layer 5 and third mixed light-emitting layer 13. The carriers are injected into the adjacent mixed light-emitting layer without being trapped by the mixed transport layer, which contains no dopant.

The organic element of this embodiment of the present invention emitted white light with light having a central wavelength of 480 nm, light having a central wavelength of 520 nm and light having a central wavelength of 620 nm overlapping each other. The emitted light had spectra due to the red, green and blue colors emitted from the sub-pixels in the light-emitting display device. Therefore, the element is suitable for light-emitting display devices. It attained a brightness of 1000 $cd/m^2$, when a voltage of 9 V was applied thereto.

The organic light-emitting element of this embodiment comprised the first mixed light-emitting layer 4 responsible for emitting a blue color, second mixed light-emitting layer 5 for a green color and third mixed light-emitting layer 14 for a red color in this order from the lower electrode side. However, no problem is anticipated when the order is changed. In this case, an energy barrier for hole or electron injection is produced in the absence of voltage between the electrodes. Presence of an energy barrier is advantageous in some cases when balance between hole and electron injection is collapsed.

The first mixed light-emitting layer 4 and first mixed transport layer 12 contained the common hole transport material of HMTPD and electron transport material of BCP. It is preferable for the deposition system to have a structure with an on-off shutter in the injection section in the evaporation source for each material, or with the evaporation and injection sections separated by a valve, so that a given deposition rate and 0 deposition rate can be switched from each other.

In the above case, HMTPD, BCP and DSA are deposited each at a given rate for the first mixed light-emitting layer 4, and then the first mixed transport layer 12 is formed by evaporation after deposition of DSA is stopped.

The above system allows continuous formation of the first mixed light-emitting layer 4 and first mixed transport layer 12.

The second mixed light-emitting layer 5, second mixed transport layer 13 and third mixed light-emitting layer 14 contained the common hole transport material of α-NPD and electron transport material of Alq3. Therefore, the second mixed light-emitting layer 5, second mixed transport layer 13 and third mixed light-emitting layer 14 can be continuously formed, when the deposition system having α-NPD, Alq3, rubrene and DCM2 deposition sources is designed in such a way that a given deposition rate and 0 deposition rate can be switched from each other at each deposition source.

Example 4

Figure 4:
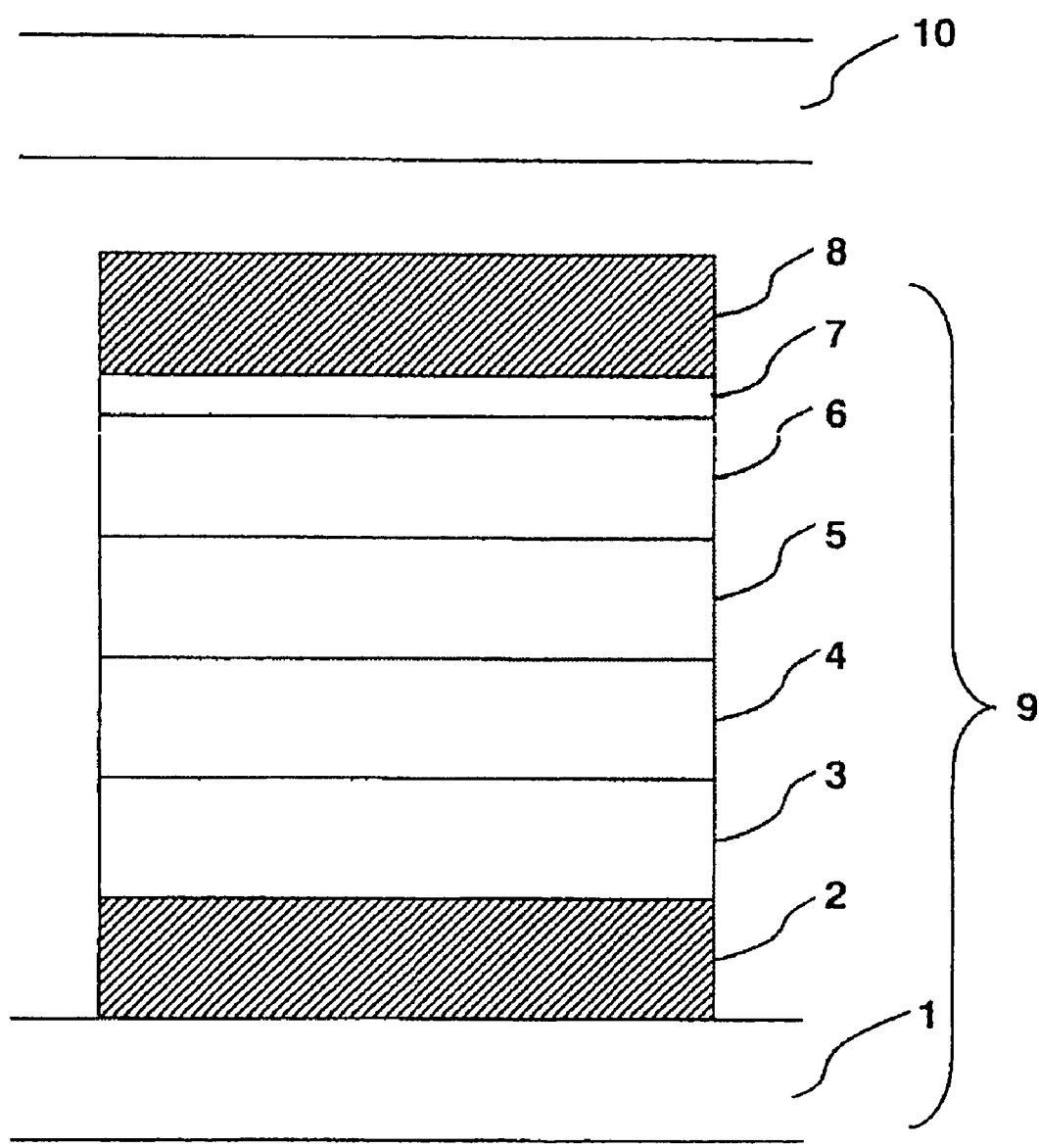
FIG. 4 illustrates still another embodiment of the organic light-emitting element (prepared in EXAMPLE 4).

EXAMPLE 4 discusses a dopant concentration of each of two types of mixed light-emitting layers, corresponding to mobility of a hole and electron transport materials for these layers by referring to FIG. 4.

The glass board 1 was coated with the lower electrode 2 and hole transport layer 3 in the same manner as in EXAMPLE 1.

Next, the hole transport layer 3 was coated with a 5 nm thick codeposited film of α-NPD, basophenanthroline (hereinafter referred to as Bphen) and rubrene by vacuum deposition. Starting materials for α-NPD, Bphen and rubrene, each put in a sublimation boat of molybdenum, were codeposited, where the deposition rates were controlled at 0.20±0.01, 0.20±0.01 and 0.08±0.002 nm/second, respectively. The codeposited film worked as the first mixed transport layer 4.

Next, the first mixed light-emitting layer 4 was coated with a 5 nm thick codeposited film of α-NPD, Alq3 and DCM2 by vacuum deposition. Starting materials for α-NPD, Alq3 and DCM2, each put in a sublimation board of molybdenum, were deposited, where the deposition rates were controlled at 0.20±0.01, 0.20±0.01 and 0.008±0.002 nm/second, respectively. The codeposited film worked as the second mixed light-emitting layer 5.

The second mixed light-emitting layer 5 was coated with the electron transport layer 6, electron injection layer 7 and upper electrode 8 in the same manner as in EXAMPLE 1. Next, the organic EL board 9 was sealed by the sealing board 10 under the same conditions as used in EXAMPLE 1.

The organic light-emitting element of this embodiment emits light, which is a mixture of yellow light emitted from the first mixed light-emitting layer 4 and red light emitted from the second mixed light-emitting layer 5. α-NPD had a hole mobility (hereinafter referred to as $\mu_H$) of $9 \times 10^{-4}$ cm$^2$/V/second at an electric field intensity of $5.5 \times 10^5$ V/cm, and Bphen had an electron mobility (hereinafter referred to as $\mu_e$) of $5.2 \times 10^{-4}$ cm$^2$/V/second at an electrical field intensity of $5.5 \times 10^5$ V/cm. Alq3 had a $\mu_e$ of $0.02 \times 10^{-4}$ cm$^2$/V/second at an electrical field intensity of $5.5 \times 10^5$ V/cm. Mobility of each material depends on electric field intensity to only a limited extent, and each mobility level described above can be used as a standard in a range of voltage applied to the organic light-emitting element of this embodiment.

Of the above-described constituent materials, Alq3 had an at least 2 digits lower $\mu_e$ level than the others. Consequently, charge balance between the holes injected from the hole transport layer 3 and electrons injected from the electron transport layer 6 is deteriorated in the first light-emitting layer 4 and also in the second mixed light-emitting layer 5 to decrease light-emitting efficiency. The organic light-emitting element of this embodiment trapped carriers by the dopant. In order to improve charge balance in the first mixed light-emitting layer 4 and second mixed light-emitting layer 5, concentration of rubrene as the dopant in the first mixed light-emitting layer 4 was kept 10 times higher than that of DCM2 as the dopant in the second mixed light-emitting layer 5 to decrease hole transport capacity of the first mixed light-emitting layer 4.

The organic element of this embodiment of the present invention emitted light of spectra with light having a central wavelength of 520 nm and light having a central wavelength of 620 nm overlapping each other. It attained a brightness of 1000 cd/m$^2$, when a voltage of 6.5 V was applied thereto. For comparison, the same element except that concentration of rubrene as the dopant in the first mixed light-emitting layer 4 was set at 2% attained a brightness of 1000 cd/m$^2$, when a voltage of 7.5 V was applied thereto. Its lowered characteristics conceivably resulted from deteriorated charge balance.

Example 5

Figure 5:
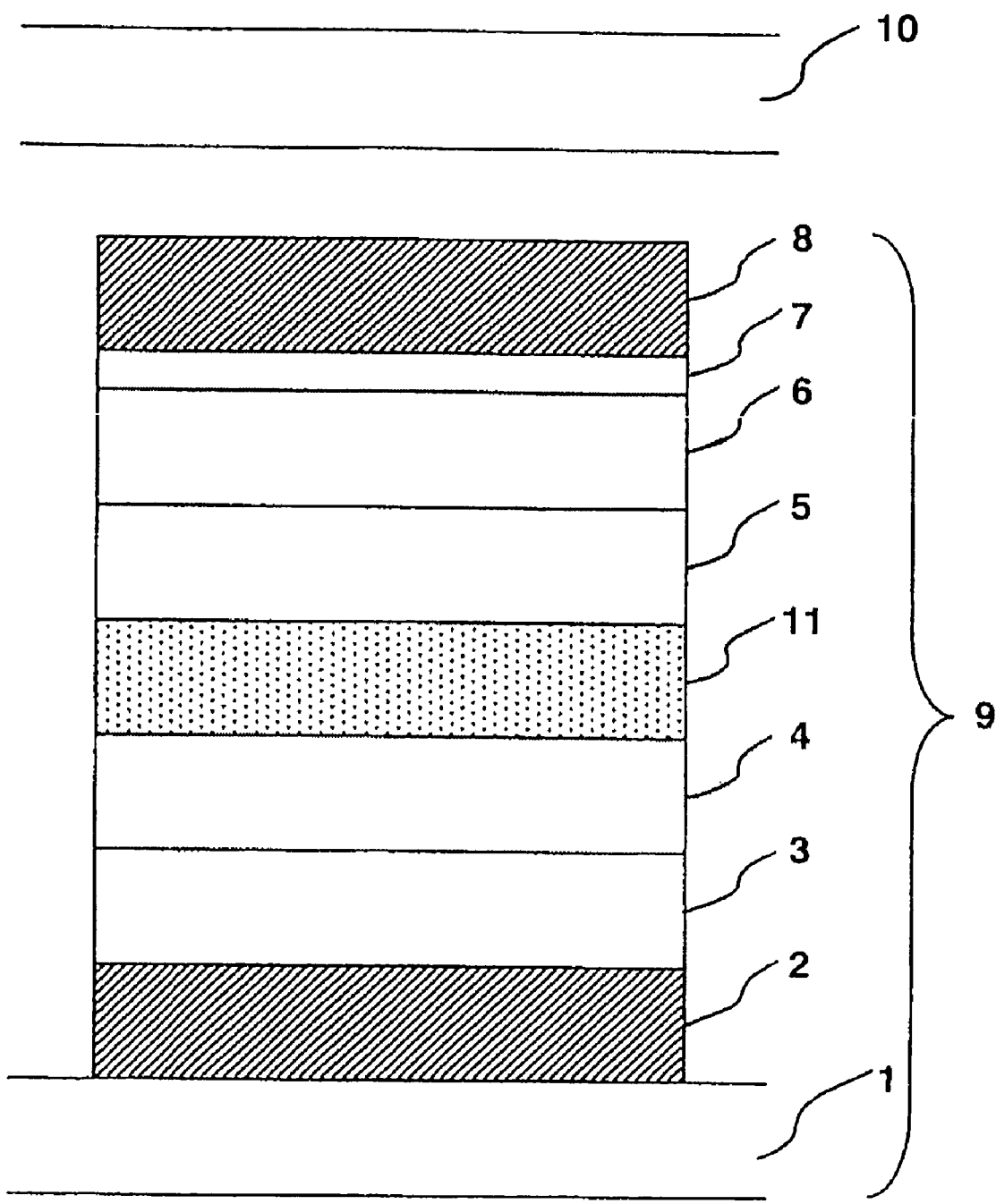
FIG. 5 illustrates still another embodiment of the organic light-emitting element (prepared in EXAMPLE 5).

EXAMPLE 5 provided an embodiment different from that of EXAMPLE 4 to discuss a dopant concentration of each of two types of mixed light-emitting layers, corresponding to mobility of a hole and electron transport materials for these layers by referring to FIG. 5.

The glass board 1 was coated with the lower electrode 2, hole transport layer 3 and first mixed light-emitting layer 4 in the same manner as in EXAMPLE 1.

Next, the first mixed light-emitting layer 4 was coated with a 15 nm thick codeposited film of α-NPD and Alq3 by vacuum deposition. Starting materials for α-NPD and Alq3, each put in a sublimation boat of molybdenum, were codeposited, where the deposition rate was controlled at 0.15±0.01 nm/second for these materials. The codeposited film worked as the first mixed transport layer 11.

Next, the mixed transport layer 11 was coated with the second mixed light-emitting layer 5 in the same manner as in EXAMPLE 4.

The second mixed light-emitting layer 5 was coated with the electron transport layer 6, electron injection layer 7 and upper electrode 8 in the same manner as in EXAMPLE 1.

Next, the organic EL board 9 was sealed by the sealing board 10 under the same conditions as used in EXAMPLE 1.

The organic light-emitting element of this embodiment had the first light-emitting element 4 and second light-emitting element 5 of improved charge balance, like the one prepared in EXAMPLE 4.

Moreover, the carrier transport into the light-emitting region is separated from that into the adjacent light-emitting region with the mixed light-emitting layer responsible for the former and the mixed transport layer for the latter. This allows the total thickness to increase while keeping the carrier-trapping mixed light-emitting layer thin. Increasing the total thickness prevents short circuit between the lower electrode 2 and upper electrode 8.

The organic light-emitting element of this embodiment of the present invention emitted light of spectra with light having a central wavelength of 560 nm and light having a central wavelength of 620 nm overlapping each other. It attained a brightness of 1000 cd/m$^2$, when a voltage of 7 V was applied thereto. For comparison, the same element except that concentration of rubrene as the dopant in the first mixed light-emitting layer 4 was set at 2% attained a brightness of 1000 cd/m$^2$, when a voltage of 8 V was applied thereto. Its lowered characteristics conceivably resulted from deteriorated charge balance.

Example 6

Figure 6:
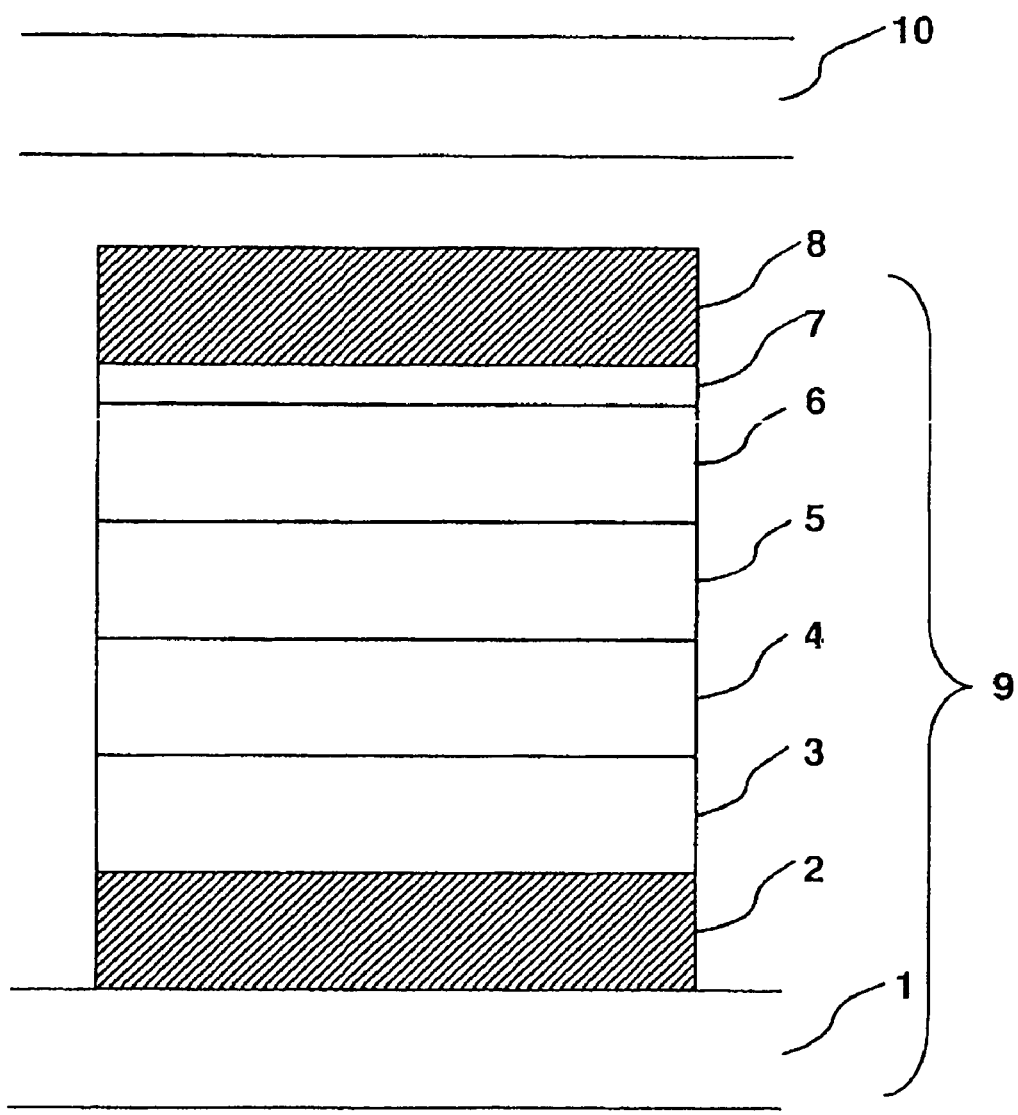
FIG. 6 illustrates still another embodiment of the organic light-emitting element (prepared in EXAMPLE 6).

Still another embodiment of the laminated layer with two types of light-emitting layers having a common electron transport material is described by referring to FIG. 6.

The glass board 1 was coated with the lower electrode 2, hole transport layer 3 and first mixed light-emitting layer 4 in the same manner as in EXAMPLE 1.

Next, the first mixed light-emitting layer 4 was coated with a 5 nm thick codeposited film of α-NPD, BCP and rubrene by vacuum deposition. Starting materials for α-NPD, BCP and rubrene, each put in a sublimation boat of molybdenum, were codeposited, where the deposition rates were controlled at 0.20±0.01, 0.20±0.01 and 0.01±0.005 nm/second, respectively. The codeposited film worked as the second light-emitting layer 5.

The second mixed light-emitting layer 5 was coated with the electron transport layer 6, electron injection layer 7 and upper electrode 8 in the same manner as in EXAMPLE 1. Next, the organic EL board 9 was sealed by the sealing board 10 under the same conditions as used in EXAMPLE 1.

The organic light-emitting element of this embodiment had the first light-emitting element 4 and second light-emitting element 5 containing a common electron transport material of BCP. This simplifies constituent material designs. In particular, there are not many available electron transport materials, and it is difficult to secure 2 or more types of electron transport materials having an ionization potential higher than that of a hole transport material.

The organic light-emitting element of this embodiment of the present invention emitted white light with light having a central wavelength of 480 nm and light having a central wavelength of 560 nm overlapping each other. It attained a brightness of 1000 cd/m$^2$, when a voltage of 8.5 V was applied thereto.

Example 7

Figure 7:
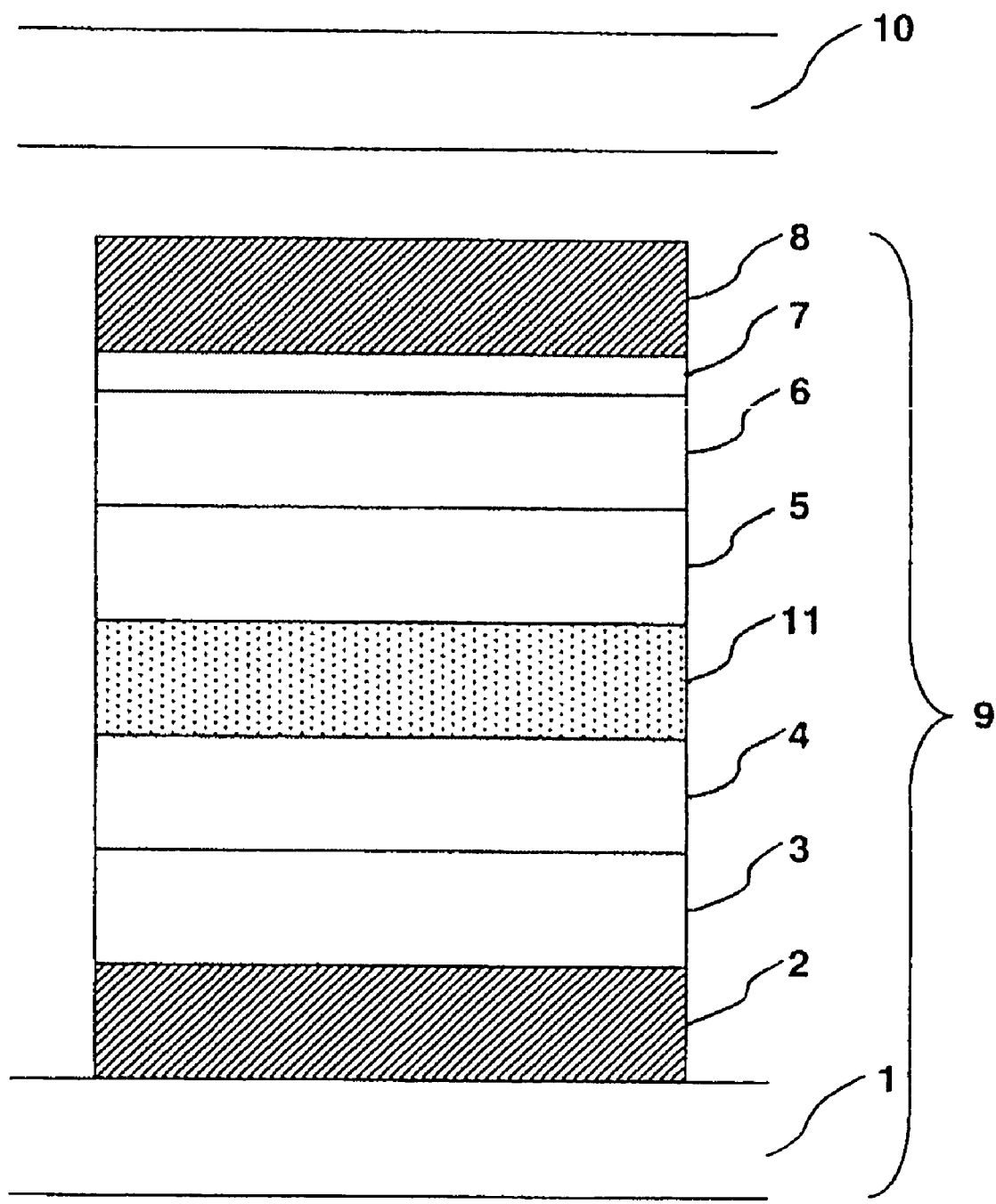
FIG. 7 illustrates still another embodiment of the organic light-emitting element (prepared in EXAMPLE 7).

EXAMPLE 7 provided still another embodiment of the laminated layer with a mixed transport layer placed between two types of light-emitting layers, wherein a common electron transport material was used. This is described by referring to FIG. 7.

The glass board 1 was coated with the lower electrode 2, hole transport layer 3 and first mixed light-emitting layer 4 in the same manner as in EXAMPLE 1.

Next, a 15 nm thick codeposited film of HMTPD and BCP was formed by vacuum deposition. Starting materials for HMTPD and BCP, each put in a sublimation boat of molybdenum, were codeposited, where the deposition rate was controlled at 0.20±0.01 nm/second for these materials. The codeposited film worked as the mixed transport layer 11. Next, the mixed transport layer 11 was coated with the second light-emitting layer 5, electron transport layer 6, electron injection layer 7 and upper electrode 8 in the same manner as in EXAMPLE 1. Next, the organic EL board 9 was sealed by the sealing board 10 under the same conditions as used in EXAMPLE 1.

The organic light-emitting element of this embodiment of the present invention emitted white light with light having a central wavelength of 480 nm and light having a central wavelength of 560 nm overlapping each other. It attained a brightness of 1000 cd/m$^2$, when a voltage of 8.0 V was applied thereto.

Example 8

Figure 8:
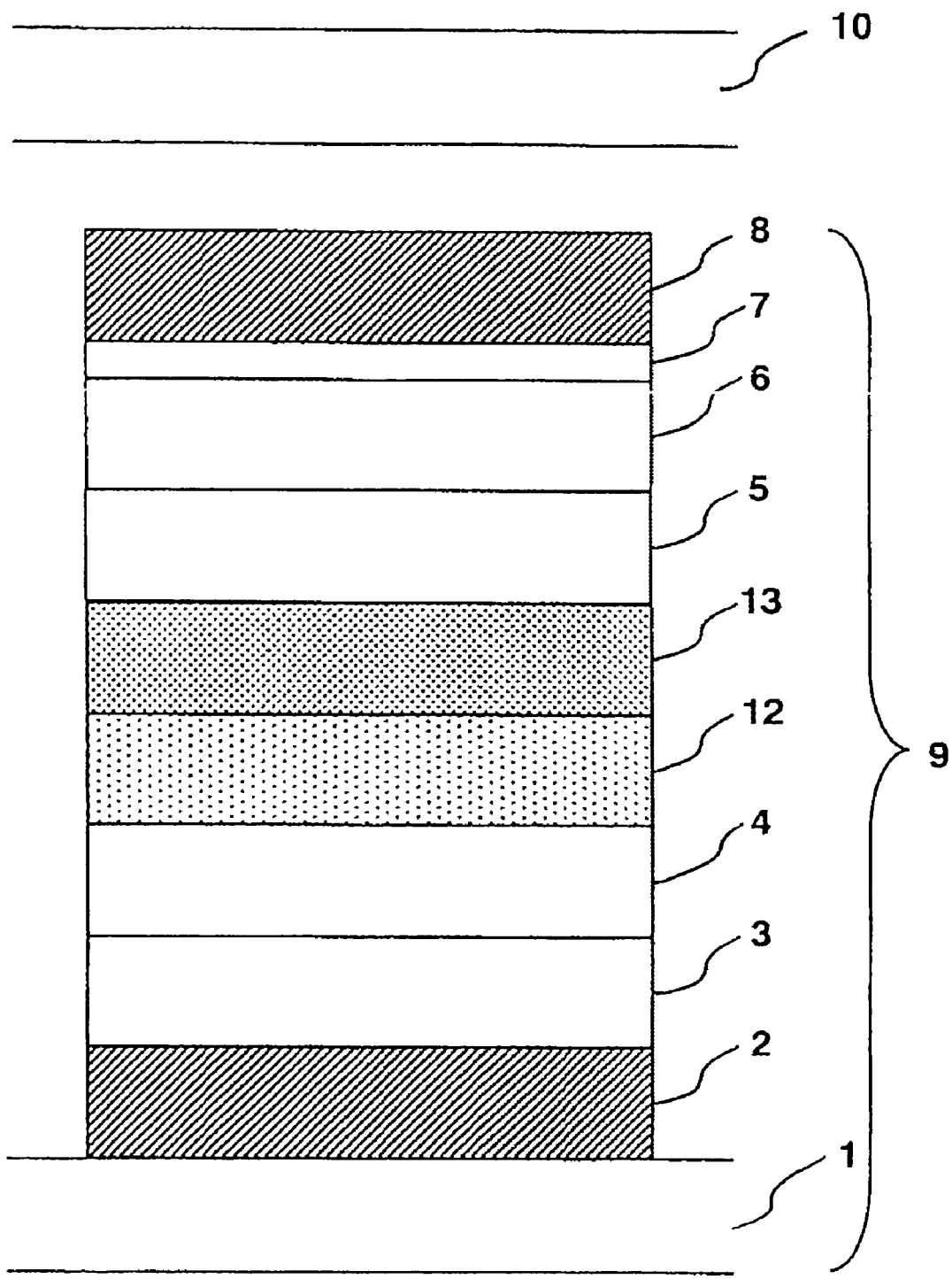
FIG. 8 illustrates still another embodiment of the organic light-emitting element (prepared in in EXAMPLE 8).

Still another embodiment of the laminated layer with two types of mixed transport layers placed between two types of light-emitting layers is described by referring to FIG. 8.

The glass board 1 was coated with the lower electrode 2, hole transport layer 3 and first mixed light-emitting layer 4 in the same manner as in EXAMPLE 1.

Next, the first mixed light-emitting layer 4 was coated with the first mixed transport layer 12, second mixed transport layer 13, the second mixed light-emitting layer 5, electron transport layer 6, electron injection layer 7 and upper electrode 8 in the same manner as in EXAMPLE 3.

The first mixed light-emitting layer 4 and first mixed transport layer 12 comprised the common hole transport and electron transport materials. Therefore, these layers can be continuously formed, when the deposition system having the hole transport material, electron transport material and dopant deposition sources is designed in such a way that a given deposition rate and 0 deposition rate can be switched from each other at each deposition source.

Moreover, the second mixed transport layer 13 and second mixed light-emitting layer 5 comprised the common hole transport and electron transport materials. Therefore, these layers can be continuously formed, when the deposition system having the hole transport material, electron transport material and dopant deposition sources is designed in such a way that a given deposition rate and 0 deposition rate can be switched from each other at each deposition source.

In the organic light-emitting element of this embodiment, the laminated layer comprising the first mixed light-emitting layer 4 and first mixed transport layer 12 had the same thickness as the laminated layer comprising the second mixed transport layer 13 and second mixed light-emitting layer 5. This design enhances through-put, because these laminated layers can be produced in the same deposition time, i.e., tact time.

The organic light-emitting element of this embodiment of the present invention emitted white light with light having a central wavelength of 480 nm and light having a central wavelength of 560 nm overlapping each other. It attained a brightness of 1000 cd/m$^2$, when a voltage of 9.0 V was applied thereto.

Example 9

Figure 9:
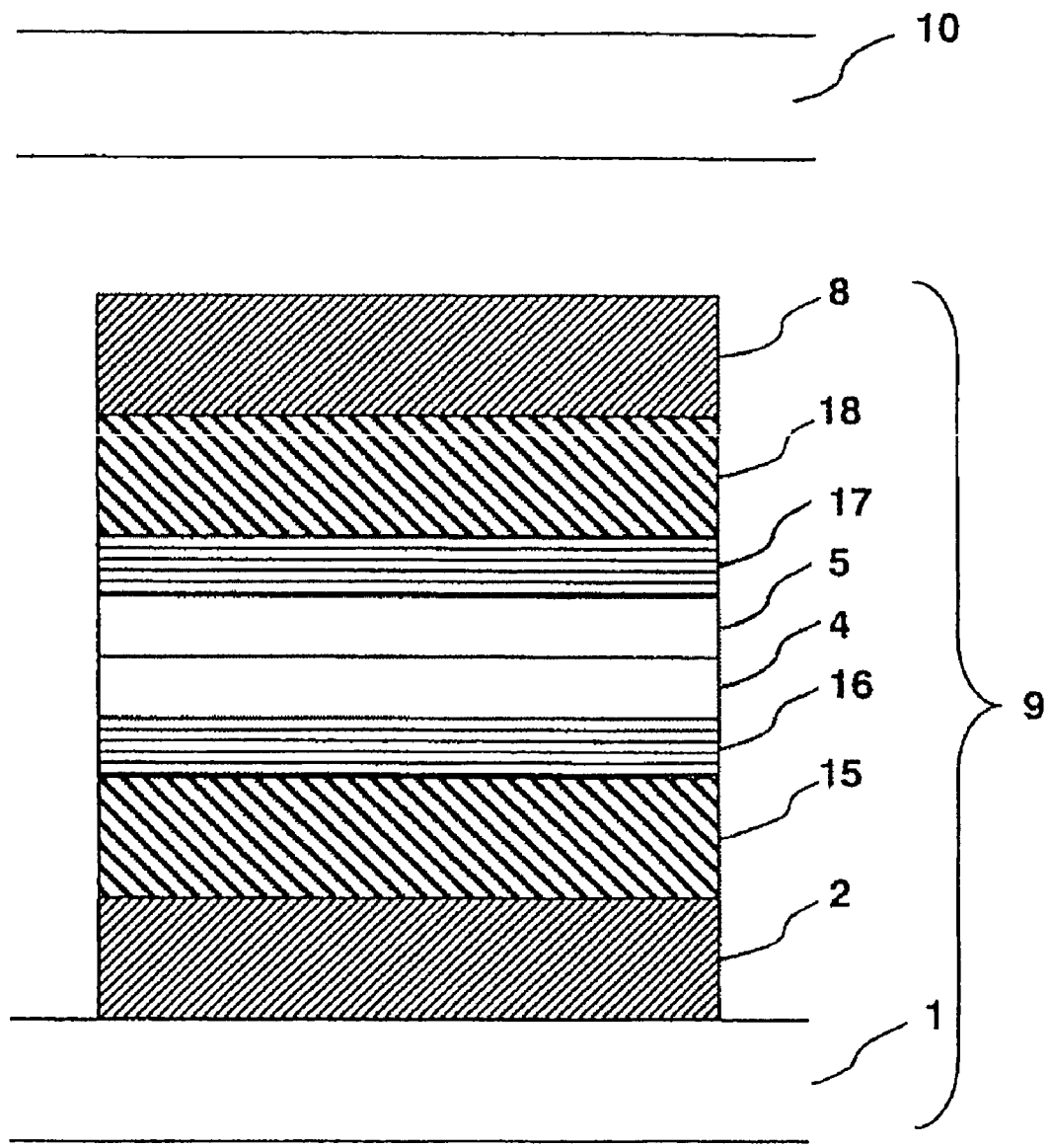
FIG. 9 illustrates still another embodiment of the organic light-emitting element (prepared in EXAMPLE 9).

Still another embodiment of the laminated layer with two types of mixed light-emitting layers and doped mixed transport layers is described by referring to FIG. 9, where 15: hole transport layer, 16: first block layer, 17: second block layer and 18: electron transport layer.

The glass board 1 was coated with the lower electrode 2 in the same manner as in EXAMPLE 1. Next, the lower electrode 2 was coated by vacuum deposition with a 100 nm thick codeposited film of 4,4',4"-tris-[N-(m-tolyl)-N-phenylamino]triphenylamine (hereinafter referred to as m-MTDATA) and tetra-2,3,5,6-tetrafluoro-7,7,8,8-cyanoquinodimethane (hereinafter referred to as F4-TCNQ). Starting materials for m-MTDATA and F4-TCNQ, each put in a sublimation boat of molybdenum, were codeposited, where the deposition rates were controlled at 0.40±0.05 and 0.008±0.002 nm/second, respectively. The codeposited film worked as the hole transport layer 15.

Next, the hole transport layer 15 was coated by vacuum deposition with a 5 nm thick film of N,N-diphenyl-N,N-bis (4-methylphenyl)-4,4-diamine (hereinafter referred to as TPD). A starting material for TPD, put in a sublimation boat of molybdenum, was deposited, where the deposition rate was controlled at 0.15±0.01 nm/second. The deposited film worked as the first block layer 16.

Next, the first block layer 16 was coated with the first mixed light-emitting layer 4 and second mixed light-emitting layer 5 in the same manner as in EXAMPLE 1.

Next, the second mixed light-emitting layer 5 was coated with a 5 nm thick film of Bphen by vacuum deposition. A starting material for Bphen, put in a sublimation boat of molybdenum, was deposited, where the deposition rate was controlled at 0.20±0.01 nm/second. The deposited film worked as the second block layer 17.

Next, the second block layer 17 was coated with a 30 nm thick codeposited film of Bphen and Li by vacuum deposition by vacuum deposition. Starting materials for Bphen and Li, each put in a sublimation boat of molybdenum, were codeposited using a Li dispenser (SAES Getters), where the deposition rate was controlled at 0.20±0.01 nm/second for these materials. The codeposited film worked as the electron transport layer 18.

Next, the electron transport layer 18 was coated with the upper electrode in the same manner as in EXAMPLE 1.

Next, the organic EL board 9 was sealed by the sealing board 10 under the same conditions as used in EXAMPLE 1.

The organic light-emitting element of this embodiment of the present invention comprised the hole transport layer 15 doped with F4-TCNQ. The doping decreased volumetric resistance of the hole transport layer 15 from $10^9$ Ωcm or more to $10^6$ Ωcm. On the other hand, volumetric resistance of the electron transport layer 18, which was also doped with Li, decreased from $10^9$ Ωcm or more to $10^4$ Ωcm. The decreased resistance of these layers increased electric field intensity at the same voltage, and the element attained a brightness of 1000 cd/m$^2$, when a voltage of 4 V was applied thereto. It was on a level with that prepared in EXAMPLE 1 in spectra of emitted light and service life.

The organic light-emitting element structure is not limited to the above. For example, the structure disclosed by EXAMPLE 4 or 6 may be used.

Example 10

Figure 10:
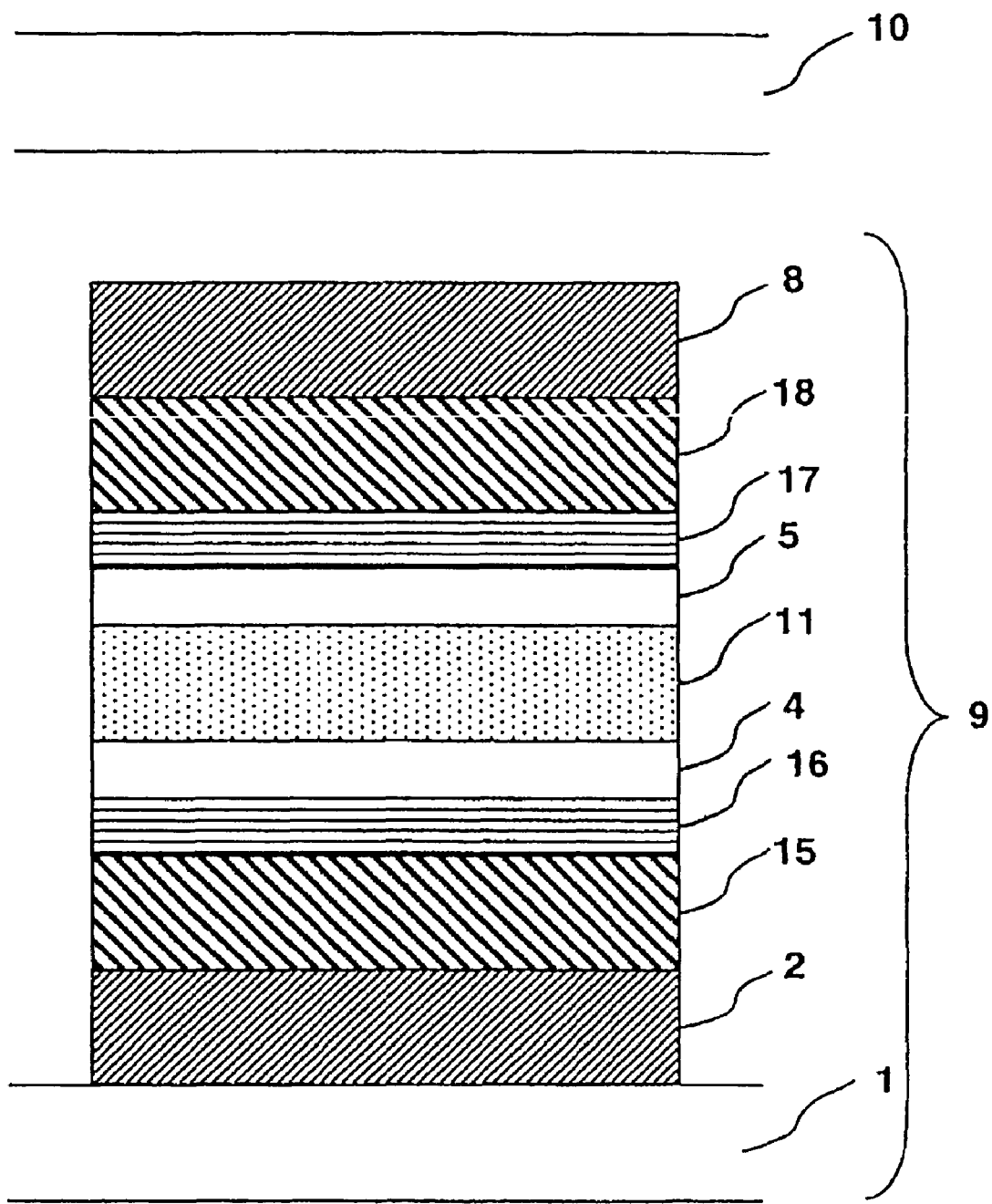
FIG. 10 illustrates still another embodiment of the organic light-emitting element (prepared in EXAMPLE 10).

EXAMPLE 10 provided an embodiment different from that prepared in EXAMPLE 9 to describe the laminated layer with two types of mixed light-emitting layers and doped mixed transport layers by referring to FIG. 10.

The glass board 1 was coated with the lower electrode 2, hole transport layer 15, first block layer 16 and first mixed light-emitting layer 4 in the same manner as in EXAMPLE 9. Next, the first mixed light-emitting layer 4 was coated with a 15 nm thick codeposited film of HMTPD and BCP by vacuum deposition. Starting materials for HMTPD and BCP, each put in a sublimation boat of molybdenum, were codeposited, where the deposition rate was controlled at 0.2±0.01 nm/second for these materials. The codeposited film worked as the mixed transport layer 11.

Next, the mixed transport layer 11 was coated with the second mixed light-emitting layer 5, second block layer 17, electron transport layer 18 and upper electrode 8 in the same manner as in EXAMPLE 9. Next, the organic EL board 9 was sealed by the sealing board 10 under the same conditions as used in EXAMPLE 1.

The organic light-emitting element of this embodiment of the present invention comprised the hole transport layer 15 and electron transport layer 16 both decreased in volumetric resistance, like the one prepared in EXAMPLE 7. Consequently, it attained a brightness of 1000 cd/m$^2$, when a voltage of 3.5 V was applied thereto. It was on a level with that prepared in EXAMPLE 1 in spectra of emitted light and service life.

The organic light-emitting element structure is not limited to the above. For example, the structure disclosed by EXAMPLE 2, 3, 5, 7 or 8 may be used.

Example 11

Figure 11:
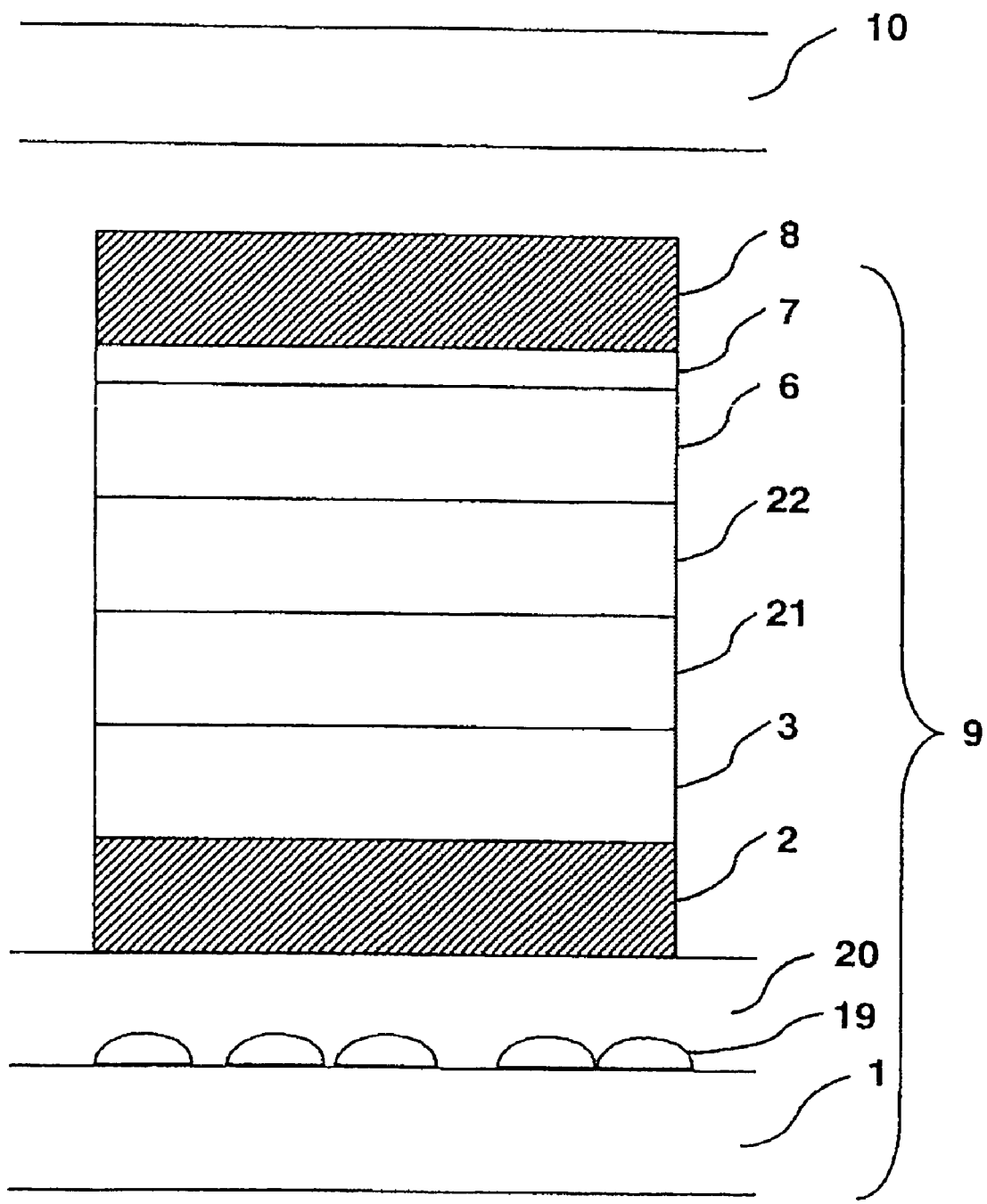
FIG. 11 illustrates still another embodiment of the organic light-emitting element (prepared in EXAMPLE 11).

Still another embodiment of the laminated layer provided with a diffuse reflection layer to reduce the light interference effect is described by referring to FIG. 11, where 19: diffuse reflection layer, 20: interlayer insulation film, 21: first light-emitting layer and 22: second light-emitting layer.

A melt flow resist as a projection-forming material was spread over the glass board 1 by spin coating to a thickness of 0.8 μm. It was pre-baked at 80° C. for 30 minutes, and exposed to light after it was covered with a photomask with randomly arranged circular openings, placed in parallel to the glass board.

When it was developed by a developer, the portions light-shielded by the photomask were removed to leave fine, columnar projections of the resist on the surface.

Next, the projections were cured by an adequate method, e.g., natural cooling, and were coated with a thin metallic film of a material of high reflectance, e.g., aluminum or silver, by an adequate method, e.g., vacuum deposition.

Then, the thin metallic film was treated by exposure, development or the like into an island shape to form the diffuse reflection layer 19.

Next, the diffuse reflection layer 19 was coated with a positive, photosensitive protective film (JSR, PC452) by spin coating, where PC452 was spread at 1000 rpm for 30 seconds, pre-baked at 90° C. for 2 minutes after the coated glass board 1 was placed on a hot plate, and then post-baked in a clean oven at 220° C. for 1 hour. The film worked as the interlayer insulation film 20.

The interlayer insulation film 20 was coated with the lower electrode 2 and hole transport layer 3 in the same manner as in EXAMPLE 1.

Next, the hole transport layer 3 was coated with a 20 nm thick film of a distyryl arylene derivative (hereinafter referred to as DPVBi). A starting materials for DPVBi, put in a sublimation boat of molybdenum, was deposited, where the deposition rate was controlled at 0.20±0.01 nm/second. The deposited film worked as the first light-emitting layer 21.

Next, the first light-emitting layer 21 was coated with a 40 nm thick codeposited film of Alq3 and rubrene by vacuum deposition. Starting materials for Alq3 and rubrene, each put in a sublimation boat of molybdenum, were codeposited, where the deposition rates were controlled at 0.40±0.05 and 0.01±0.005 nm/second, respectively. The codeposited film worked as the second light-emitting layer 22.

Next, the second light-emitting layer 22 was coated with the electron transport layer 6 in the same manner as in EXAMPLE 1.

Next, the electron transport layer 6 was coated with the electron injection layer 7 and upper electrode 8 in the same manner as in EXAMPLE 2.

Next, the organic EL board 9 was sealed by the sealing board 10 under the same conditions as used in EXAMPLE 1.

The lower electrode 2 for the organic light-emitting element of this embodiment of the present invention was transparent. Consequently, light emitted by the first light-emitting layer 21 and second light-emitting layer 22 towards the lower electrode 2 was transmitted by the lower electrode 2 and reflected by the diffuse reflection layer 19. No interference occurred between the above reflected light and light emitted by the first light-emitting layer 21 and second light-emitting layer 22 towards the upper electrode 8. Therefore, light transmitted by the upper electrode 8 received no influence from interference caused by layered structure or thickness of each layer, with the result that no emitted light spectra or light intensity change occurred with respect to viewing angle.

The organic light-emitting element of this embodiment of the present invention emitted white light with light having a central wavelength of 450 nm and light having a central wavelength of 560 nm overlapping each other. It attained a brightness of 1000 cd/m$^2$, when a voltage of 10 V was applied thereto.

The organic light-emitting element of this embodiment comprised the first light emitting layer 21 and second light-emitting layer 22. However, no problem is anticipated when it comprises one light-emitting layer instead of two.

Example 12

Figure 12:
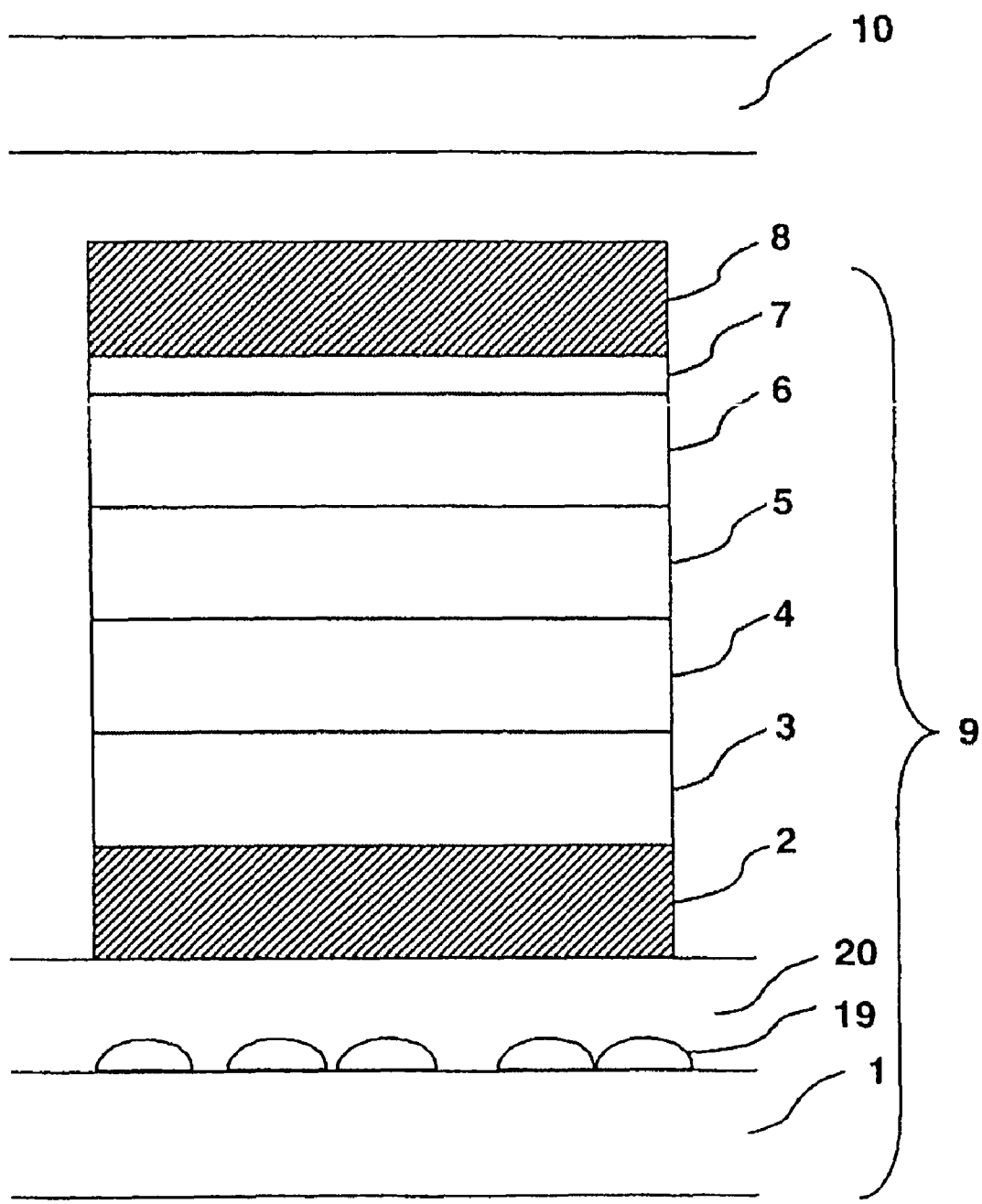
FIG. 12 illustrates still another embodiment of the organic light-emitting element (prepared in EXAMPLE 12).

EXAMPLE 12 provided an embodiment different from that prepared in EXAMPLE 11 to describe the laminated layer provided with a diffuse reflection layer to reduce the light interference effect by referring to FIG. 12.

The glass board 1 was coated with the diffuse reflection layer 19, interlayer insulation film 20, lower electrode 2 and hole transport layer 3 in the same manner as in EXAMPLE 11.

Next, the hole transport layer 3 was coated with the first mixed light-emitting layer 4, second mixed light-emitting layer 5 and electron transport layer 6 in the same manner as in EXAMPLE 1.

Next, the electron transport layer 6 was coated with the electron injection layer 7 and upper electrode 8 in the same manner as in EXAMPLE 11.

Next, the organic EL board 9 was sealed by the sealing board 10 under the same conditions as used in EXAMPLE 1.

The organic light-emitting element of this embodiment of the present invention showed no spectra or light intensity change of emitted light with respect to viewing angle, like the one prepared in EXAMPLE 11.

The organic light-emitting element of this embodiment of the present invention emitted white light with light having a central wavelength of 480 nm and light having a central wavelength of 560 nm overlapping each other. It attained a brightness of 1000 cd/m$^2$, when a voltage of 10 V was applied thereto. The element having an initial brightness of 1000 cd/m$^2$ also showed a good service life of around 2000 hours, when driven at a constant current.

Example 13

Figure 13:
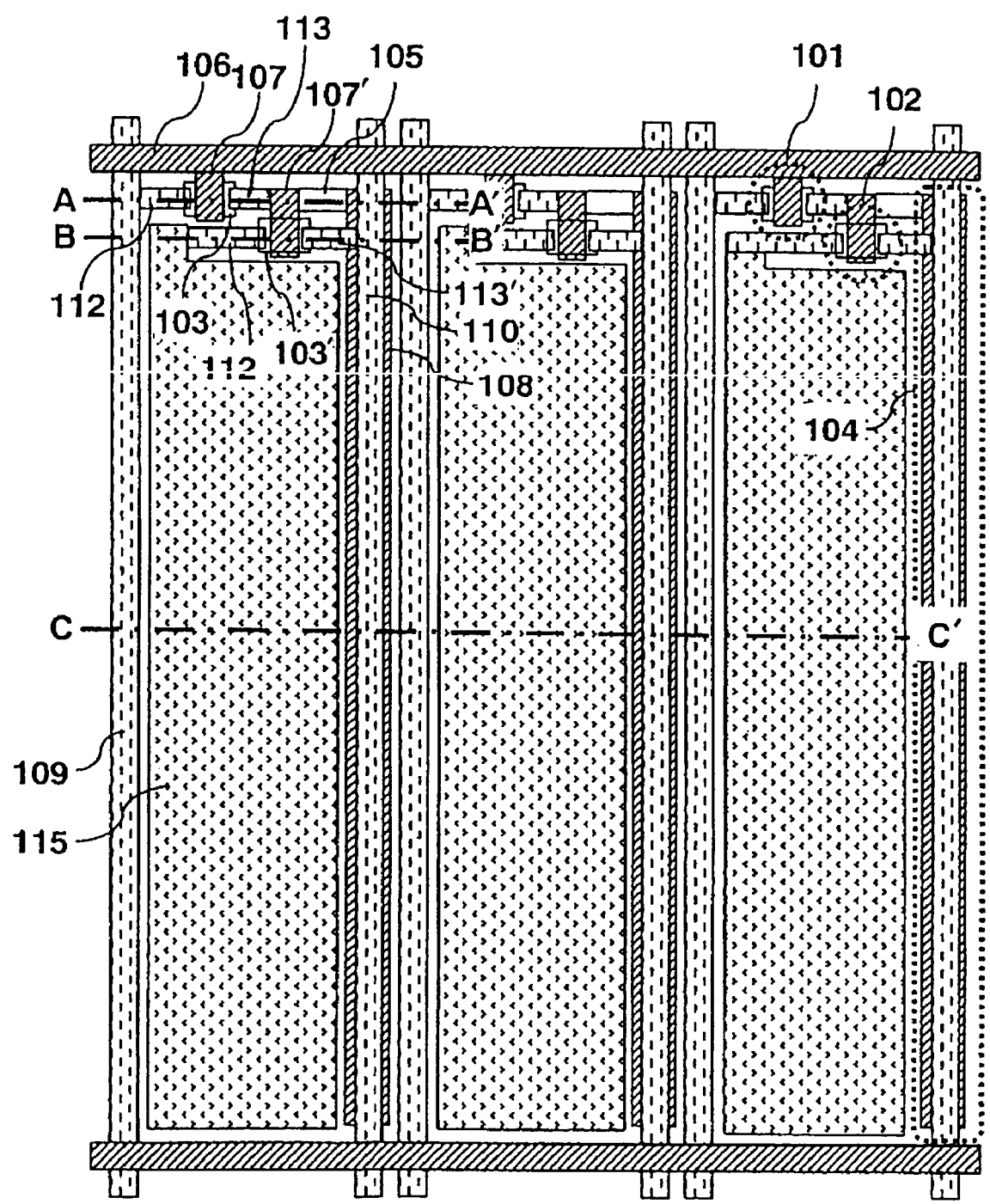
FIG. 13 is a plan view illustrating one embodiment of the organic light-emitting image display device, (prepared in EXAMPLE 13).
Figure 15:
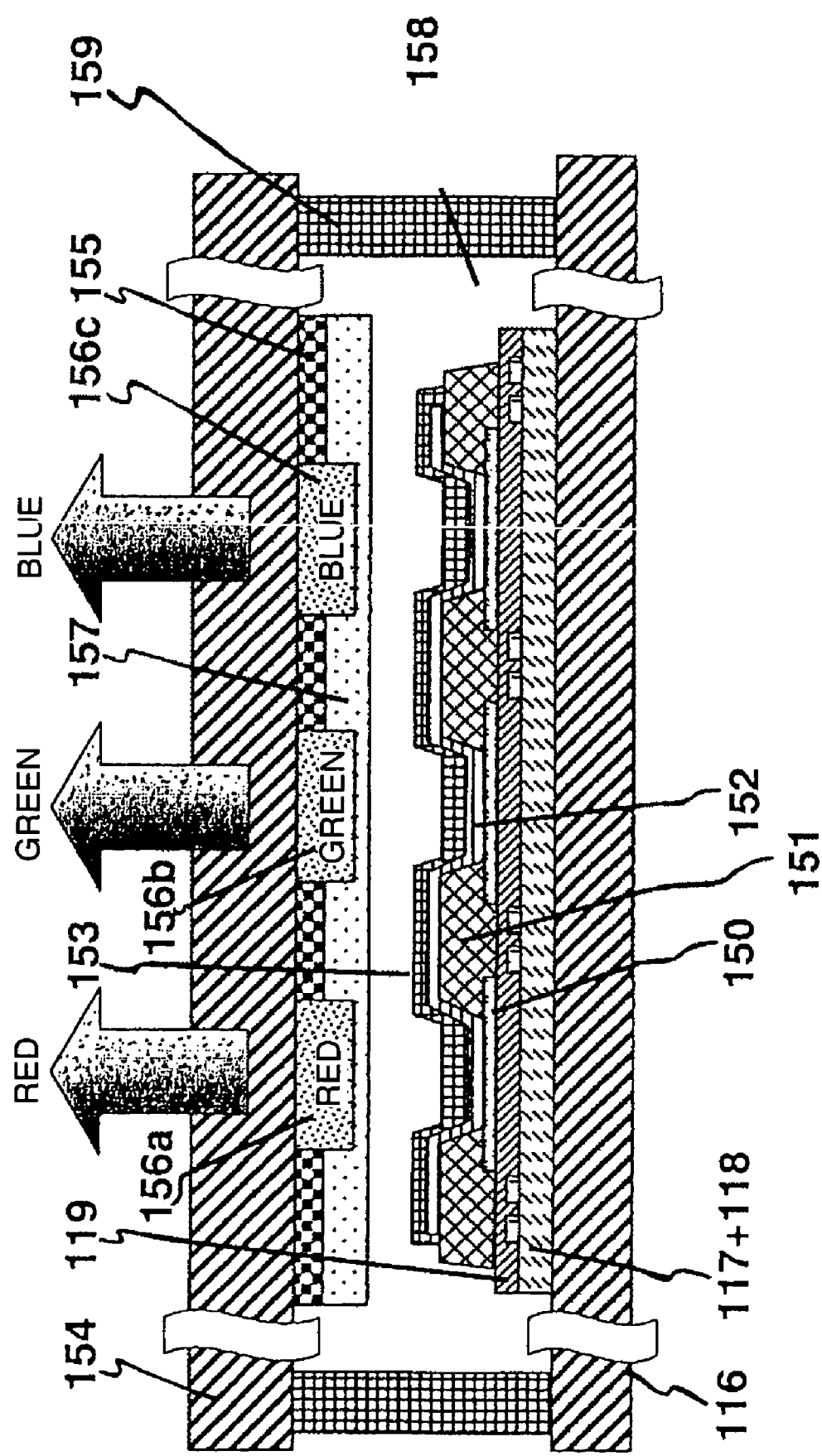
FIG. 15 is another cross-sectional view illustrating one embodiment of the organic light-emitting image display device (prepared in EXAMPLE 13).

Next, an embodiment of the image display device of the present invention is described by referring to the drawings. FIG. 13 is a plan view of the image display device. FIGS. 14 (a) and (b) are cross-sectional views of the device shown in FIG. 13, cut along the line A-A' and B-B', and FIG. 15 is the cross-sectional view of the device cut along the line C-C'. The glass board 116, shown in each of FIGS. 13 to 15, supports scanning lines 106 arranged at constant intervals, and signal lines 109 for transmitting image information also arranged at constant intervals. These scanning lines 106 and signal lines 109 run at a right angle to each other to form a reticular pattern, where each region defined by the scanning lines 106 and signal lines 109 represents a pixel or sub-pixel. The glass board 116 also supports first current supply lines 110 connected to a power source, which run in parallel to the signal lines 109. Each of the scanning lines 106, signal lines 109 and first current supply lines 110 is placed as an interconnect in an interconnection layer on the glass board 116 via an interlayer insulation film.

Organic light-emitting elements which constitute a pixel as the minimum color image unit are arranged on the interconnection layer. Each organic light-emitting element, working as a sub-pixel, comprises the organic layer 152 placed between the lower electrode 150 and upper electrode 153, the organic layer 152 containing a hole transport layer, light-emitting layer, electron transport layer and electron injection layer. The lower electrode 150 for the organic light-emitting element in each pixel is connected to the first current supply line 110 via a transistor working as a driving element, and the upper electrode 153 for the organic light-emitting element in each pixel is connected to the second current supply line connected to a power source (not shown).

The glass board 116 also supports a driving layer which drives the organic layer in each pixel. The driving layer comprises the first transistor 101, second transistor 102 and capacitor 104 working as the driving elements. The first transistor 101 has a gate, source and drain connected to the scanning line 106, signal line 109, and the second transistor gate and upper electrode 108 for the capacitor 104, respectively. The second transistor 102 has a drain and source connected to the lower electrode 105 for the capacitor 104 and first current supply line 110, and lower electrode 150, respectively.

Next, the method for producing the organic light-emitting image display device of the above structure is described. First, the glass board 116 is coated with a 50 nm thick amorphous silicon (a-Si) film by low-pressure chemical vapor deposition (LPCVD), where SiO$_2$H$_6$ serves as a starting material and the board is kept at 450° C. in this embodiment. Next, the film is totally treated by laser-aided annealing using a XeCl excimer laser in two stages, at an irradiation energy of 188 mJ/cm$^2$ in the first stage and 290 mJ/cm$^2$ in the second stage. This crystallizes amorphous silicon into polycrystalline silicon (p-Si). Next, the polycrystalline silicon is patterned by dry etching with CF$_4$, to form the active layer 103 for the first transistor 101, active layer 103' for the second transistor 102 and lower electrode 105 for the capacitor.

Next, a 100 nm thick SiO$_2$ film is formed as the gate insulation film 117. It is formed by plasma-enhanced chemical vapor deposition (PECVD) using tetraethoxysilane (TEOS) as a starting material.

Next, a 50 nm thick TiW film is formed by sputtering as the gate electrodes 107 and 107', and patterned. The scanning lines 106 and upper electrode 108 for the capacitor are also patterned simultaneously.

The phosphorus (P) ions are injected by ion implantation from the upper side of the gate insulation film 117 into the patterned polycrystalline silicon layer at a rate of 4×10$^{15}$ ions/cm$^2$ and energy of 80 keV. In this step, no P ion is injected into the regions covered by the gate electrode 107 or 107'. These regions become the active layers 103 and 103'.

Next, the coated glass board 116 is heated at 300° C. for 3 hours in an inert N$_2$ atmosphere, to activate the ions and thereby to facilitate doping. The polycrystalline silicon (p-Si) regions into which the ions are implanted have an areal resistivity of 2 kΩ. These regions are coated with a 200 nm thick silicon nitride (SiNx) film as the first interlayer insulation film 118.

Next, contact holes (not shown) are formed in the gate insulation film 117 and first interlayer insulation film 118 on both ends of the active layers 103 and 103', and also in the first interlayer insulation film 118 on the gate electrode 107' for the second transistor 102.

A 500 nm thick Al film is formed on these layers by sputtering. The signal line 109 and first current supply line 110 are formed by photolithography.

Then, the source electrode 112 and drain electrode 113 for the first transistor 101, and source electrode 112' and drain electrode 113' for the second transistor 102 are formed.

Next, lower electrode 105 for the capacitor is connected to the drain electrode 113 for the first transistor 101, and so are the source electrode 112 for the first transistor 101 to the signal line 109, the drain electrode 113 for the first transistor 101 to the gate electrode 107' for the second transistor 102, the drain electrode 113' for the second transistor 102 to the first current supply line 110, and the upper electrode 108 for the capacitor 104 to the first current supply line 110.

Next, a 500 nm thick silicon nitride (SiNx) film is formed as the second interlayer insulation film 119. Contact holes (not shown) are formed on the drain electrode 113' for the second transistor 102. The drain electrode 113' is then coated with a 150 nm thick Cr film by sputtering, and treated by photolithography to form the lower electrode 150.

Next, a positive, photosensitive protective film (JSR, PC452) is formed as the third interlayer insulation film 151 by spin coating, where PC452 is spread at 1000 rpm for 30 seconds, pre-baked at 90° C. for 2 minutes after the coated glass board 116 is placed on a hot plate.

Next, it is exposed to mixed ghi ray after being covered with a phostomask to form stripe-shaped contact holes 114. It is then developed by a developer (JSR, PD-523) at room temperature for 40 seconds, and rinsed in a flow of pure water at room temperature for 60 seconds. It is then post-exposed to light having a wavelength of 365 nm at an intensity of 300 mJ/cm$^2$, and post-baked in a clean oven at 220° C. for 1 hour.

The third interlayer insulation film 151 of PC452 is 2 µm thick, and used to cover the lower electrode 150 to 3 µm from the edges. The contact holes connecting the drain electrode 113' to the lower electrode 150 are also covered, to prevent short circuit between the lower electrode 150 and upper electrode 153, described later.

Next, an organic light-emitting element structure working as a pixel is described by referring to FIG. 14. The glass board 116, coated with layers to the lower electrode 150, is washed ultrasonically with acetone and then pure water each for 3 minutes, and dried by spinning and then at 120° C. for 30 minutes in an oven.

Next, it is treated by O$_2$ plasma cleaning in a plasma cleaning chamber kept at a vacuum of 3 Pa under conditions of O$_2$ flow rate: 22 mL/minute, RF power: 200 W and cleaning time: 3 minutes. Then, the treated glass board 116 is transferred into a vacuum deposition chamber without being exposed to air.

Next, the lower electrode 150 is coated with the organic layer 152 comprising a hole transport layer, first mixed light-emitting layer, second mixed light-emitting layer and electron transport layer in the same manner as in EXAMPLE 1.

Next, the organic layer 152 is coated with a 10 nm thick mixed Mg/Ag layer by vacuum deposition (2-element simultaneous deposition), where the deposition rates are controlled at 0.14±0.01 and 0.01±0.005 nm/second, respectively. The mixed Mg/Ag layer works as the electron injection layer.

Next, the electron injection layer is coated with a 50 nm thick In—Zn—O (hereinafter referred to as IZO) film by sputtering. This film works as the second electrode 125 and is amorphous. The sputtering is carried out under conditions of atmosphere: Ar/O$_2$ mixed gas, degree of vacuum: 0.2 Pa and sputtering output: 2 W/cm$^2$, with In/(In+Zn) (=0.83) as the target. The resulting Mg/Ag/In—Zn—O laminated film works as the upper electrode 153 and has a transmittance of 65%.

The TFT board 154 is produced by the above procedure.

Next, the method for producing the opposed board 161 is described. A 150 nm thick Cr film is formed on a glass board by sputtering, and is treated by photolithography to form a reticular pattern by removing the Cr film in the regions each corresponding to the region immediately above the opening in the lower electrode 150 for each sub-pixel, i.e., portion not covered with the third interlayer insulation film 151, where the region from which the Cr film is removed is larger than the opening by alignment accuracy needed when the opposed board 161 is put on the TFT board 154. This film works as the black matrix (hereinafter referred to as BM) layer 162.

Next, a 1.5 µm thick polyimide film dispersed with a blue pigment, e.g., copper phthalocyanine is formed on the glass board on which the BM layer 162 is formed, and is treated by photolithography to form the blue-coloring layer 163*c*. The similar procedure is repeated twice, to form the green-coloring layer 163*b* and red-coloring layer 163*a*.

Next, a 2 µm thick acryl resin film is formed by spin coating, and coated with a 150 nm thick SiNx film by thermal CVD. The laminated film works as the protective layer 164.

Next, the method for attaching the TFT board 154 supporting the organic light-emitting elements as pixels to the opposed board 161 supporting a color filter is described.

The opposed board 161 which converts color by the color filter is produced by this method.

The TFT board 154 and opposed board 161 are transferred into a sealing chamber kept at a dew point of −90° C. or less as is the board in EXAMPLE 1, and a sealant is applied to the opposed board edges in the same manner as in EXAMPLE 1. Then, the opposed board 161 is attached to the TFT board 154 in such a way that the coloring layer is aligned with the sub-pixels on the TFT board 154 using the alignment marks provided on these boards. The sealant 166 is cured with light while the TFT board 154 and opposed board 161 are pressed to each other in the same manner as in EXAMPLE 1.

A voltage of 15 V is applied from the power source to between the devices of the first current supply line, source and drain in the second transistor, organic light-emitting element as the sub-pixel, and second current supply line. Voltage at the second transistor gate is determined by the charges transferred by the signal line into the capacitor via the first transistor. It determines voltage applied to between the source and drain, and, in turn, determines voltage applied to the organic light-emitting element. The organic light-emitting element constituting the sub-pixel emits white light, which is converted into a blue, green or red color by the color-converting layer provided above.

EXAMPLE 13 has described the method for structuring and producing the color-emitting image display device which converts a white color into a blue, green or red color at each sub-pixel by the color filter using the organic white-color-emitting element comprising the 2-layered mixed light-emitting layer. However, it is to be understood that the present invention is not limited to the above structure. For example, the organic light-emitting element disclosed in one of EXAMPLES 2 to 12 may be used.

Example 14

Figure 16:
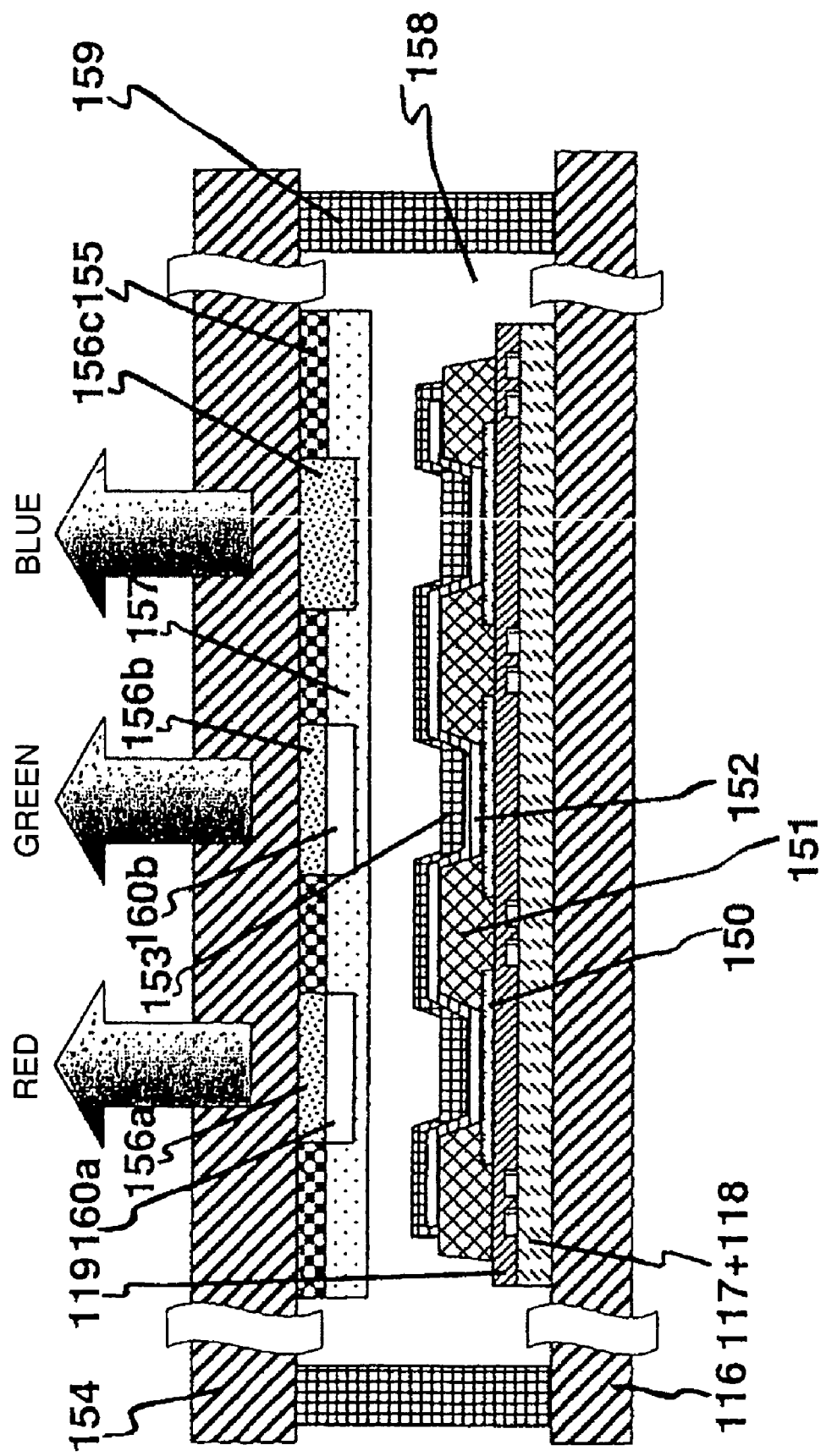
FIG. 16 illustrates another embodiment of the organic light-emitting image display device (prepared in EXAMPLE 14).

Next, another embodiment of the image display device of the present invention is described by referring to FIG. 16, which is a cross-sectional view of the device cut along the line corresponding to C-C' shown in FIG. 13.

This embodiment provides substantially the same device as that prepared in EXAMPLE 13, except that the color-converting layers 167*a* and 167*b* are used in the sections where white color emitted from the organic white-color-emitting element is converted into a red and green color by sub-pixels, respectively. A color filter is used in each of sub-pixels for blue color as is the case with EXAMPLE 13.

More specifically, it comprises the glass substrate 116 which supports the first transistor 101, capacitor 104, second transistor 102, signal lines 109, 109' and 109", scanning lines 106 and 106', first current supply lines 110, 110' and 110", first interlayer insulation film 118, second interlayer insulation film 119, lower electrode 150, third interlayer insulation film 151, organic layer 152, and upper electrode 153, formed in the same manner as in EXAMPLE 15.

Next, the method for producing the opposed board 161 is described. The BM layer 162 and coloring layer 163 are formed on a glass board in the same manner as in EXAMPLE 13.

Next, a 5 µm thick polyvinyl chloride resin film dispersed with coumarine 6 is formed on the glass board which supports the BM layer 162, and is treated by photolithography to form the green-coloring layer 167*b*. The similar procedure is repeated, to form the 5 μm thick red-coloring layer 167*a* of polyvinyl chloride resin dispersed with rhodamine 6G.

Next, a 10 μm thick acryl resin film is formed by spin coating. The film works as a flattening film. It is then coated with a 150 nm thick SiNx film by thermal CVD. The laminated film works as the protective layer 164.

Next, the TFT board 154 is attached to the opposed board 161 in the same manner as in EXAMPLE 13.

The driving method for determining brightness at each sub-pixel by the data signal transmitted by the signal line, and emission of light from each sub-pixel are the same as those in EXAMPLE 13.

EXAMPLE 14 has described the method for structuring and producing the color-emitting image display device which converts a white color into a blue, green or red color at each sub-pixel by the color filter using the organic white-color-emitting element comprising the 2-layered mixed light-emitting layer. However, it is to be understood that the present invention is not limited to the above structure. For example, the organic light-emitting element disclosed in one of EXAMPLES 2 to 12 may be used.

Example 15

Figure 17:
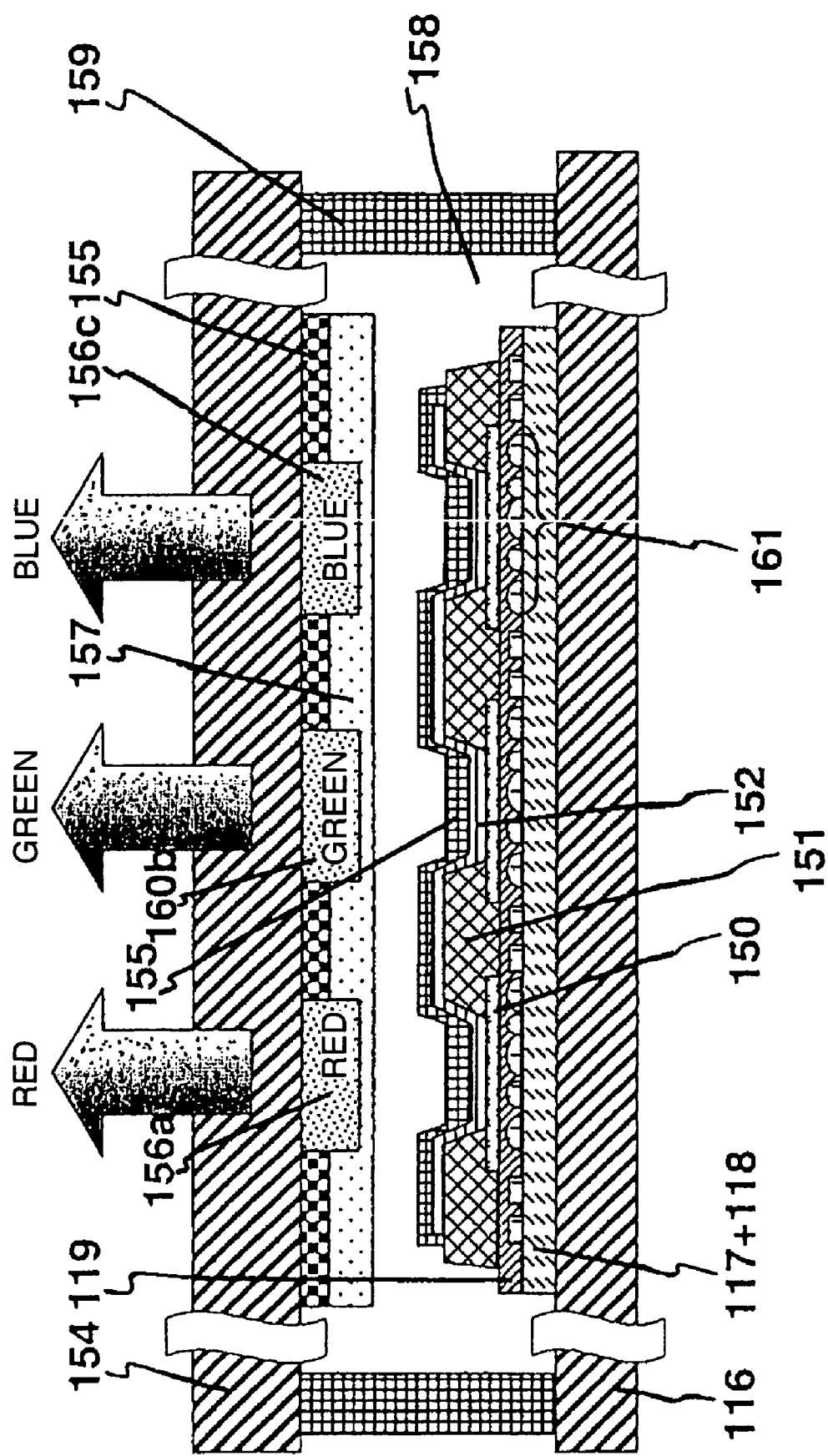
FIG. 17 illustrates still another embodiment of the organic light-emitting image display device (prepared in EXAMPLE 15).

Next, still another embodiment of the image display device of the present invention is described by referring to FIG. 17, which is a cross-sectional view of the device cut along the line corresponding to C-C' shown in FIG. 13.

This embodiment provides substantially the same device as that prepared in EXAMPLE 13, except that white color emitted from the organic white-color-emitting element is not reflected by the lower electrode but by the diffuse reflection section 168 provided below the lower electrode.

More specifically, it comprises the glass substrate 116 which supports the active layer 103 for the first transistor 101, active layer 103' for the second transistor 102, lower electrode 105 for the capacitor, gate insulation layer 117, gate electrodes 107 and 107', scanning line 106, upper electrode 108 for the capacitor, first interlayer insulation film 118, contact holes (not shown) in the first interlayer insulation film 118, and contact holes (not shown) to the first interlayer insulation film 181 above the gate electrode 117', formed in the same manner as in EXAMPLE 13.

Next, the first interlayer insulation film 118 is provided with fine, randomly arranged columnar projections of resist on the surface in the same manner as in EXAMPLE 11. These projections are positioned immediately below the lower electrode 150.

A 500 nm thick Al film is formed on the first interlayer insulation film 118 by sputtering, and then treated by photolithography to form the signal lines 109 and first current supply lines 110; and also to form the source electrode 112 and drain electrode 113 for the first transistor 101, and source electrode 112' and drain electrode 113' for the second transistor 102.

The projections are also coated with the Al film, which is treated by photolithography to form the diffuse reflection section 168 scattered like islands.

Next, a positive, photosensitive protective film (JSR, PC452) is formed by spin coating, where PC452 is spread at 1000 rpm for 30 seconds, and pre-baked at 90° C. for 2 minutes on a hot plate.

Next, it is exposed to mixed ghi ray after being covered with a phostomask to form contact holes (not shown) above the drain electrode 113' for the second transistor 102. It is then developed by a developer (JSR, PD-523) at room temperature for 40 seconds, and rinsed in a flow of pure water at room temperature for 60 seconds. It is then post-exposed to light having a wavelength of 365 nm at an intensity of 300 mJ/cm$^2$, and post-baked in a clean oven at 220° C. for 1 hour.

Next, a 150 nm thick ITO film is formed thereon by sputtering, and is treated by photolithography to form the lower electrode 150.

Next, a 300 nm thick SiNx film is formed as the third interlayer insulation film 151 to cover the lower electrode 150 to 3 μm from the edges.

It is then coated with the organic layer 152 and upper electrode 153 in the same manner as in EXAMPLE 13.

The conditions under which the opposed board 161 is formed, and method for sealing the TFT board 154 and opposed board 161 are the same as those used in EXAMPLE 13.

The driving method for determining brightness at each sub-pixel by the data signal transmitted by the signal line, and emission of light from each sub-pixel are the same as those in EXAMPLE 13.

In the organic light-emitting image display device of the present invention, part of light emitted from the mixed light-emitting layer for the organic light-emitting element which constitutes the sub-pixel passes through the upper electrode before being emitted from the device (Pathway A), and the remainder passes through the lower electrode of a transparent, electroconductive film, is reflected by the diffuse reflection layer and then passes through the upper electrode before being emitted from the device (Pathway B).

No interference occurs between light passing through Pathway A and that passing through Pathway B. Therefore, the organic light-emitting element of the present invention is advantageous in that the layered structure can be considered only to improve its characteristics.

EXAMPLE 15 has described the method for structuring and producing the color-emitting image display device which converts a white color into a blue, green or red color at each sub-pixel by the color filter using the organic white-color-emitting element comprising the 2-layered mixed light-emitting layer. However, it is to be understood that the present invention is not limited to the above structure. For example, the organic light-emitting element disclosed in one of EXAMPLES 2 to 8 may be used.

Example 16

Figure 18:
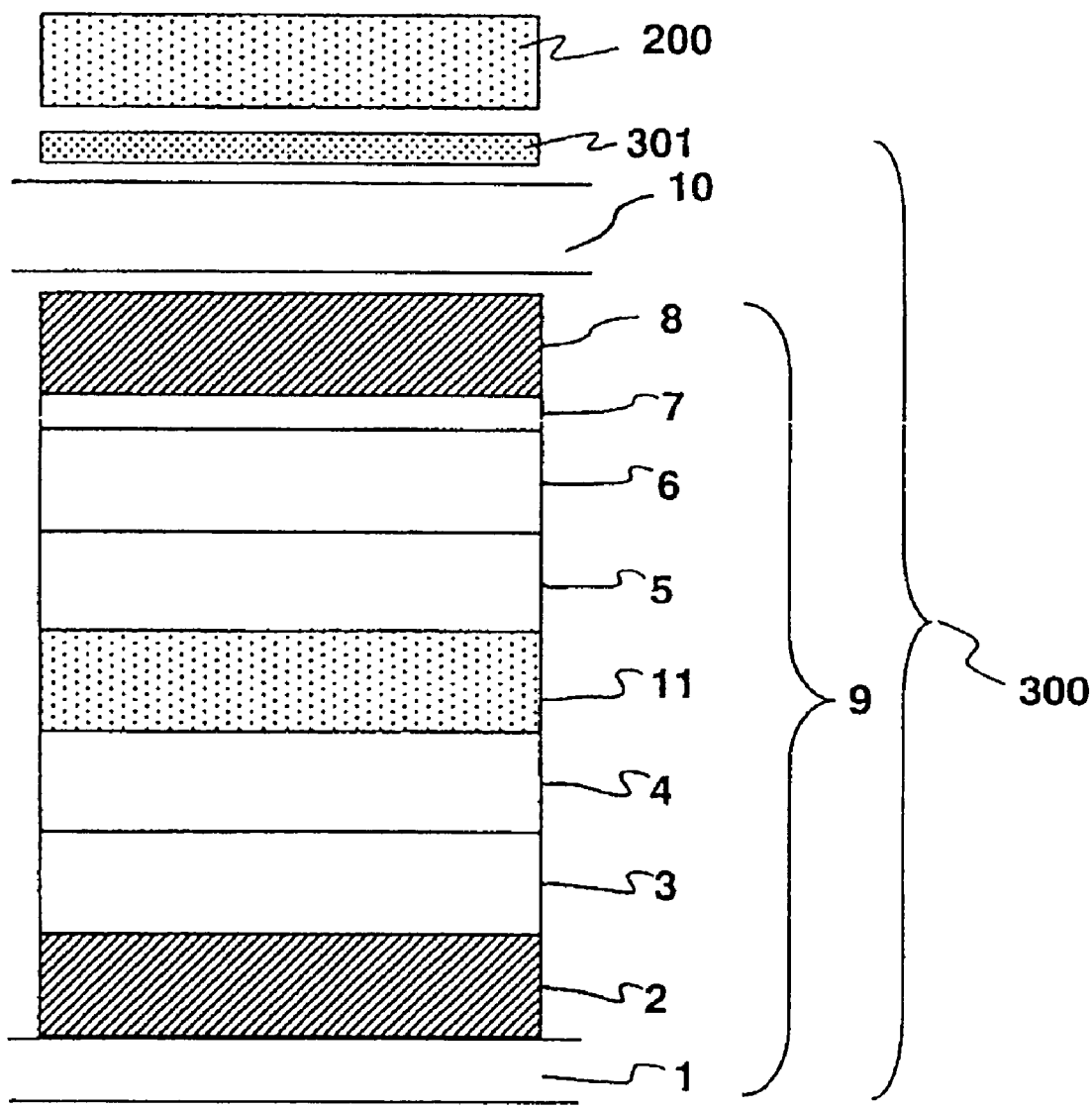
FIG. 18 is a cross-sectional view illustrating one embodiment of the liquid-crystal image display device (prepared in EXAMPLE 16).
Figure 19:
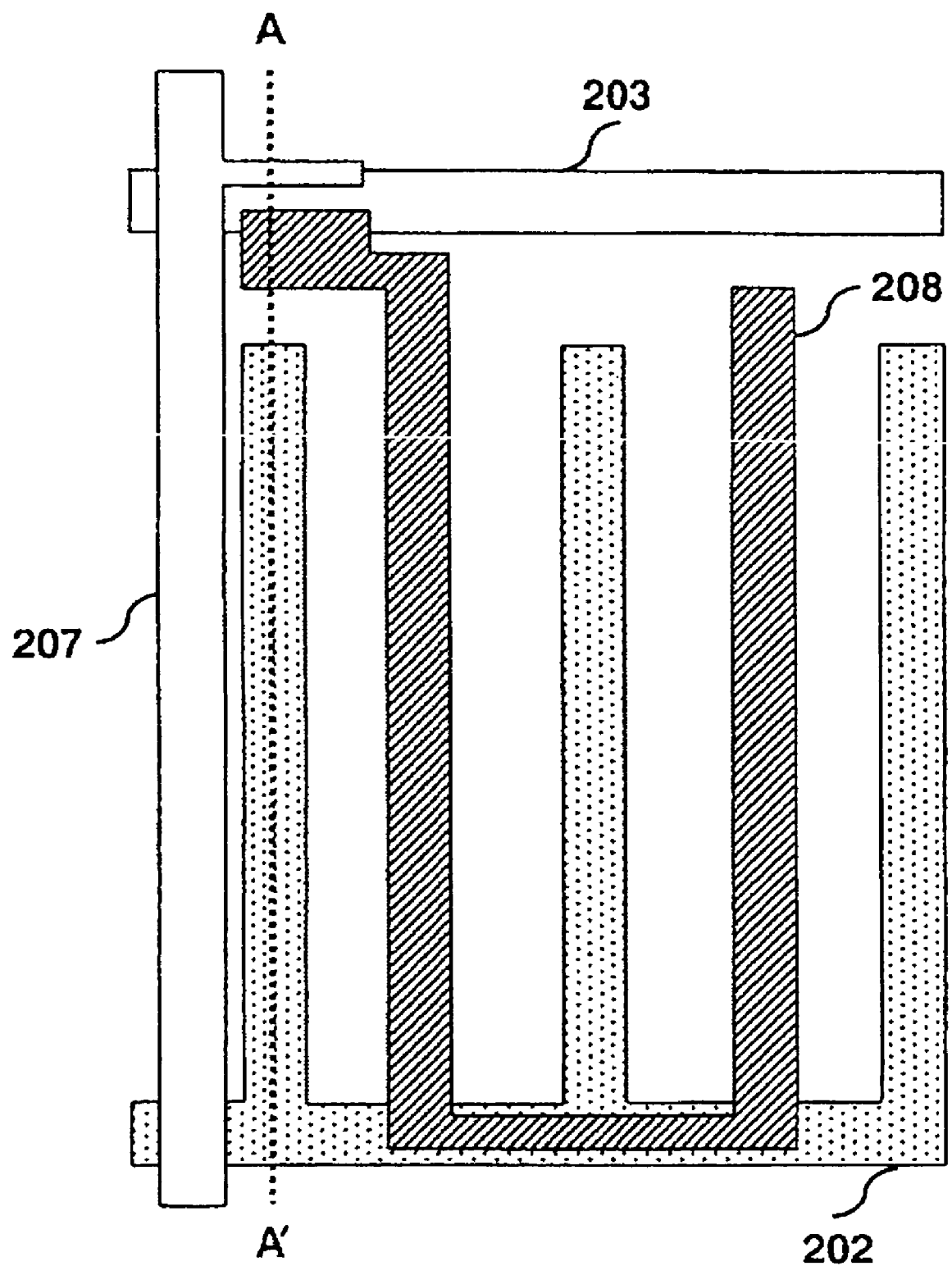
FIG. 19 is a plan view illustrating one embodiment of the liquid-crystal image display device (prepared in EXAMPLE 16).
Figure 20:
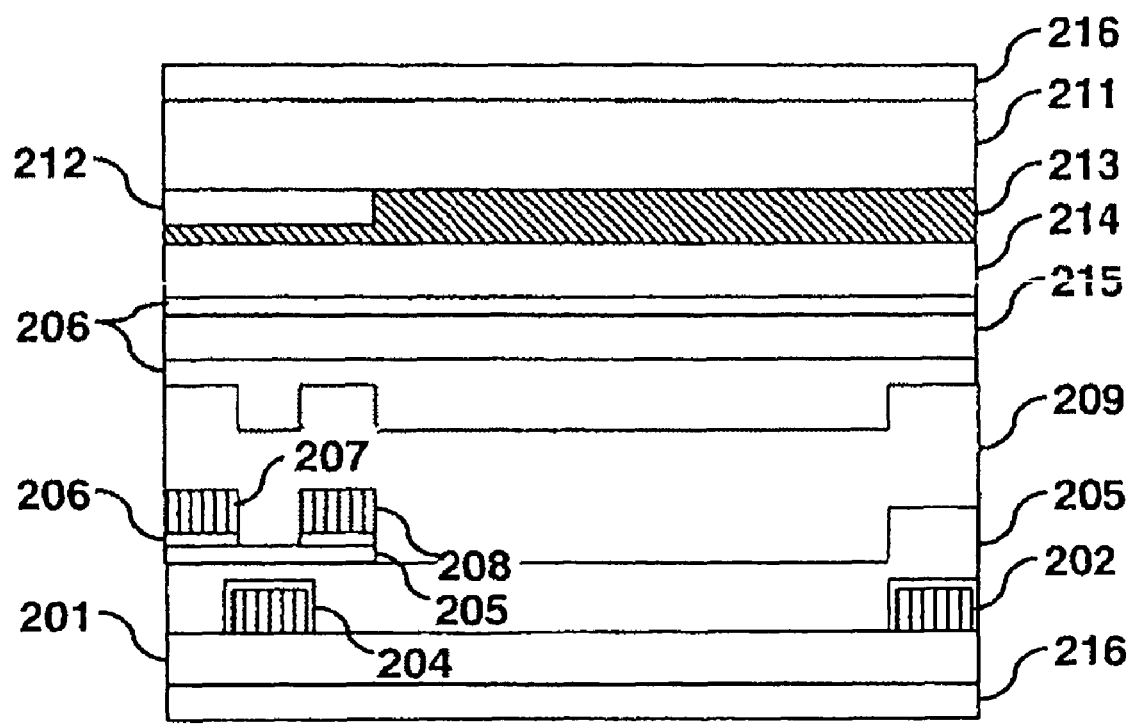
FIG. 20 is another cross-sectional view illustrating one embodiment of the liquid-crystal image display device (prepared in EXAMPLE 16).
Figure 21A:
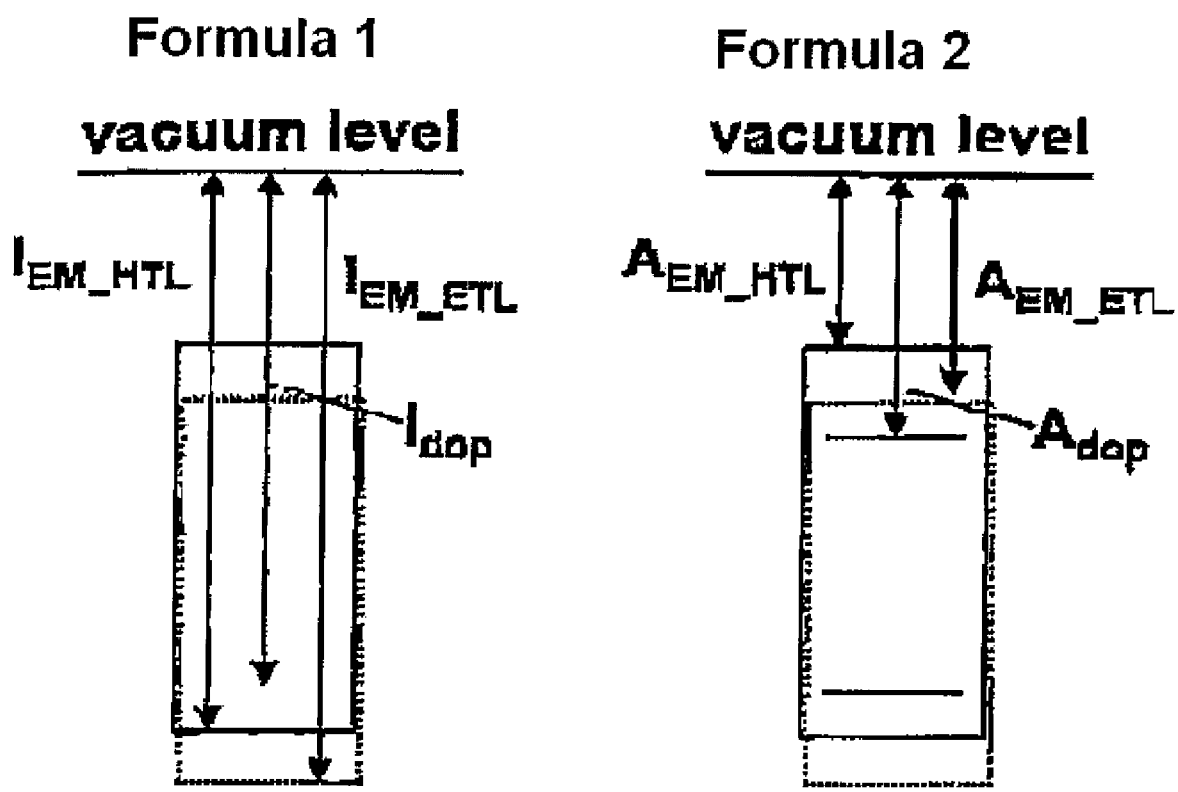
Figure 21B:
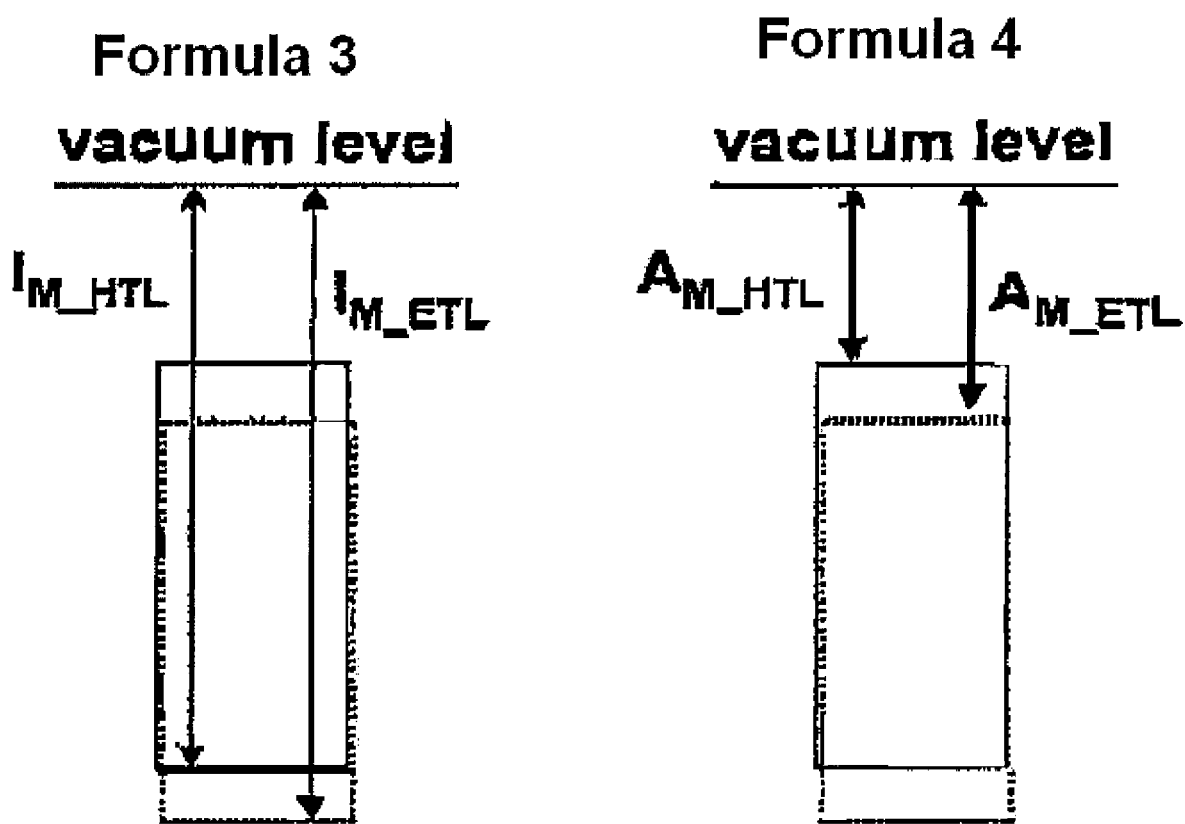

Next, an embodiment of a liquid-crystal image display device which uses the organic light-emitting element of the present invention as an illuminator is described by referring to the drawings. FIG. 18 is a cross-sectional view of the liquid-crystal image display device, FIG. 19 is a plan view of a pixel for the liquid-crystal image display device, and FIG. 20 is a cross-sectional view of the pixel cut along the line A-A' shown in FIG. 19.

First, the liquid-crystal display section 200 structure is described. The common electrode 202 of Al and scanning signal electrode 203 are formed on the glass board 201, and each of these electrodes is coated with the alumina film 204. The gate insulation film 205 of SiNx is formed over these electrodes. Formed above the film 205 are the amorphous Si (a-Si) film 206, n-type a-Si film 207, image signal electrode 208 of Al/Cr and thin film transistor (TFT) of the image electrode 209. Moreover, the above structure is coated with the protective layer 230 of SiN and oriented film 231, in this order. Each pixel is divided into 4 regions by the image signal electrode 228, common electrode 222 and pixel electrode 229. The image electrode 229 and common electrode 222 partly overlap each other to secure holding capacity. On the glass board 151 on the color filter side, i.e., opposed board to the board 201, the black matrix layer 252 and color filter 253 are formed in this order. Further the protective layer 254 for the color filter and oriented film 255 are formed, in this order, on the above structure. The liquid-crystal layer 256 is formed between the upper and lower oriented films. Each of the glass board 201 and opposed glass board 251 is coated with the polarizing plate 216.

The light transmitting axis of the polarizing plate on one board runs in parallel to the major axis of the liquid-crystal, and that of the other polarizing plate runs at a right angle to the major axis. This arrangement brings the so-called normally closed characteristics.

Next, the illuminator 300 of the organic light-emitting element is provided immediately below the liquid-crystal display section 200. The glass board 1 is coated with the hole transport layer 3, first mixed light-emitting layer 4, mixed transport layer 11, second mixed light-emitting layer 5, electron transport layer 6, electron injection layer 7 and upper electrode 8 in the same manner as in EXAMPLE 2.

Next, the organic EL board 9 was sealed by the sealing board 10 under the same conditions as used in EXAMPLE 2. The light-diffusing sheet 301 is attached to the sealing board 10 to complete the illuminator 300.

White light emitted from the organic light-emitting element for the illuminator 300 enters the liquid-crystal display section 200. When the image signal is off, the incident white light is polarized by the polarization plate 216 and cut by the liquid-crystal display section 200. As a result, it is displayed black. When the image signal is on, a voltage is applied to between the image electrode and common electrode to change the liquid-crystal sequence in such a way that the incident white light is transmitted by the liquid-crystal display section 200 and displayed white. It is then converted into a given color by the color filter layer 253.

In EXAMPLE 16, the image is displayed by the transverse electric field method, which by no means limits the present invention. For example, the image can be similarly displayed by the multidomain vertical alignment (MVA) or optically compensated bend cell (OCB) mode.

It should be further understood by those skilled in the art that although the foregoing description has been made on embodiments of the invention, the invention is not limited thereto and various changes and modifications may be made without departing from the spirit of the invention and the scope of the appended claims.

INDUSTRIAL APPLICABILITY

The light-emitting layer for the organic light-emitting element of the present invention comprises at least two mixed light-emitting layers, each being composed of a hole and electron transport materials and dopant. This structure can reduce degradation of each constitute material for the mixed light-emitting layer and makes the white-light-emitting OLED, in which it is used, highly reliable. As such, the light-emitting layer is applicable to display devices and illuminators for various purposes, including display devices.

ADVANTAGES OF THE INVENTION

The light-emitting element of the present invention uses laminated mixed layers containing materials having a high carrier transport capacity for electrons or holes. This structure can reduce degradation of constitute materials for each light-emitting layer and makes the device in which it is used highly reliable.

The invention claimed is:

1. An organic light-emitting element comprising an anode, a cathode and a light-emitting layer placed between the anode and cathode, the light-emitting layer comprising:
   a first mixed light emitting layer;
   a first mixed transport layer disposed on the first mixed light-emitting layer;
   a second mixed light-emitting layer disposed on the first mixed transport layer;
   a second mixed transport layer disposed on the second mixed light-emitting layer; and
   a third mixed light-emitting layer disposed on the second mixed transport layer,
   wherein:
   each of the mixed light-emitting layers is composed of a hole transport material, an electron transport material, and a dopant which determines a color of an emitted light, the first mixed light-emitting layer is closest to the anode side, and the third mixed light-emitting layer is closest to the cathode side,
   an electron mobility of the electron transport material at the third mixed light emitting layer is higher than a hole mobility of the hole transport material at the first mixed light-emitting layer,
   a dopant concentration of the third mixed light-emitting layer is higher than a dopant concentration of the first mixed light-emitting layer,
   the first mixed light-emitting layer and the first mixed transport layer include a common first hole transport material and a common first electron transport material,
   the second mixed light-emitting layer, the second mixed transport layer, and the third mixed light-emitting layer include a common second hole transport material and a common second electron transport material,
   the first mixed light-emitting layer emits a blue color, the second mixed light-emitting layer emits a green color, and the third mixed light-emitting layer emits a red color,
   the first hole transport material is different from the second hole transport material, the first electron transport material is different from the second electron transport material.

2. The organic light-emitting element according to claim 1, wherein the first mixed light-emitting layer is coated with the hole transport layer on an anode side thereof, and the third mixed light-emitting layer is coated with the electron transport layer on a cathode side thereof.

3. The organic light-emitting element according to claim 2, wherein the electron transport material for the electron transport layer and hole transport material for the adjacent mixed light-emitting layer satisfy the following relationship:

$$I_{M\text{-}HTL} < I_{M\text{-}ETL}$$

wherein,
$I_{M\text{-}HTL}$: ionization potential of the hole transport material for the adjacent mixed light-emitting layer
$I_{M\text{-}ETL}$: ionization potential of the electron transport material for the electron transport layer, and $$A_{M\text{-}HTL} < A_{M\text{-}ETL}$$

wherein,
$A_{M\text{-}HTL}$: electron-affinity of the hole transport material
$A_{M\text{-}ETL}$: electron-affinity of the electron transport material for the mixed light-emitting layer.

4. The organic light-emitting element according to claim 1, wherein
the hole transport material for the mixed light-emitting layer and mixed transport layer has an ionization potential kept constant or decreasing as it goes from the anode to the cathode side, or
the electron transport material for the mixed light-emitting layer and mixed transport material has an affinity for electrons kept constant or decreasing as it goes from the anode to the cathode side.

5. The organic light-emitting element according to claim 1, wherein a thickness of each of the mixed light-emitting layers is from 1 nm to 100 nm.

6. The organic light-emitting element according to claim 1, wherein the hole transport material being in contact with the anode contains an oxidizing agent and the electron-transport material being in contact with the cathode contains a reducing agent.

7. The organic light-emitting element according to claim 6, wherein
the hole transport layer is composed of at least a layer of hole transport material containing an oxidizing agent and another layer of hole transport material, and
the electron transport layer is composed of at least a layer of electron transport material containing a reducing agent and another layer of electron transport material, the layer of electron transport material containing a reducing agent being positioned closer to the cathode.

8. The organic light-emitting element according to claim 1, wherein
one of the anode and cathode works as a light-emitting electrode and the other as a light-transmitting electrode, a diffuse reflection layer being provided on the outside of the light-transmitting electrode, and light which is emitted from the light-emitting layer and transmitted by the light-transmitting electrode is reflected by the diffuse reflection layer towards the light-emitting electrode.

9. An organic light-emitting image display device which uses the organic light-emitting element according to claim 1 as the pixel.

10. The organic light-emitting image display device according to claim 9 which uses a color-converting layer.

11. An organic light-emitting image display device composed of a light-modulating element and illuminator emitting light towards the light-modulating element, wherein the illuminator uses the organic light-emitting element according to claim 1.

12. An illuminator which uses the organic light-emitting element according to claim 1 with a flexible material serving as a board.

13. The organic light-emitting element according to claim 1, wherein the hole and electron transport materials and dopant for at least one of the mixed light-emitting layers satisfies the following relationships:

$$I_{dop} < I_{EM\text{-}HTL} < I_{EM\text{-}ETL}$$

wherein, $I_{EM\text{-}HTL}$: ionization potential of the hole transport material
$I_{EM\text{-}ETL}$: ionization potential of the electron transport material
$I_{dop}$: ionization potential of the dopant, and $$A_{EM\text{-}HTL} < A_{EM\text{-}ETL} < A_{dop}$$

$A_{EM\text{-}HTL}$: electron-affinity of the hole transport material
$A_{EM\text{-}EM}$: electron-affinity of the electron transport material
$A_{dop}$: electron-affinity of the dopant.

* * * * *